(12) United States Patent
Ogino et al.

(10) Patent No.: US 8,902,348 B2
(45) Date of Patent: Dec. 2, 2014

(54) SOLID-STATE IMAGE CAPTURE DEVICE, MANUFACTURING METHOD THEREFOR, AND ELECTRONIC APPARATUS

(71) Applicant: Sony Corporation, Tokyo (JP)

(72) Inventors: Akiko Ogino, Kumamoto (JP); Yukihiro Sayama, Kagoshima (JP); Takayuki Shoya, Kumamoto (JP); Masaya Shimoji, Kumamoto (JP); Yoshikazu Tanaka, Kumamoto (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/715,384

(22) Filed: Dec. 14, 2012

(65) Prior Publication Data

US 2013/0128095 A1 May 23, 2013

Related U.S. Application Data

(62) Division of application No. 12/765,455, filed on Apr. 22, 2010, now Pat. No. 8,355,072.

(30) Foreign Application Priority Data

May 14, 2009 (JP) ................. 2009-117401

(51) Int. Cl.
| | | |
|---|---|---|
| *H04N 5/225* | (2006.01) | |
| *H01L 31/062* | (2012.01) | |
| *H01L 31/113* | (2006.01) | |
| *H01L 21/02* | (2006.01) | |
| *H01L 21/76* | (2006.01) | |
| *H01L 27/146* | (2006.01) | |
| *G02B 7/02* | (2006.01) | |
| *H01L 33/58* | (2010.01) | |
| *G02B 1/11* | (2006.01) | |
| *H01L 31/0216* | (2014.01) | |
| *H01L 31/0232* | (2014.01) | |
| *H01L 31/0236* | (2006.01) | |

(52) U.S. Cl.
CPC ........ *H04N 5/2254* (2013.01); *H01L 27/14685* (2013.01); *G02B 7/02* (2013.01); *H01L 33/58* (2013.01); *H01L 27/14625* (2013.01); *H01L 27/1462* (2013.01); *H01L 27/14627* (2013.01); *G02B 1/11* (2013.01); *H01L 31/02161* (2013.01); *H01L 27/14645* (2013.01); *H01L 31/0232* (2013.01); *H01L 31/0236* (2013.01)
USPC .............. 348/340; 257/294; 257/437; 438/72

(58) Field of Classification Search
USPC .............. 348/335, 340; 257/290–1, 294, 432, 257/437; 438/69, 72
See application file for complete search history.

(56) References Cited

U.S. PATENT DOCUMENTS

| | | |
|---|---|---|
| 2004/0209068 A1 | 10/2004 | Lin et al. |
| 2007/0030380 A1 | 2/2007 | Higuchi |

FOREIGN PATENT DOCUMENTS

| | | |
|---|---|---|
| EP | 1445095 | 8/2004 |
| EP | 1930950 | 6/2008 |

(Continued)

OTHER PUBLICATIONS

Machine Translation of JP 2008-060464 to Aozuka published Mar. 13, 2008.*

(Continued)

*Primary Examiner* — Daniel M Pasiewicz
(74) *Attorney, Agent, or Firm* — Sheridan Ross P.C.

(57) ABSTRACT

A solid-state image capture device including: at least one photoelectric converter at an image capture surface of a substrate; at least one on-chip lens at the image capture surface of the substrate and above a light-receiving surface of the photoelectric converter; and an antireflection layer on an upper surface of the on-chip lens. The antireflection layer contains a binder resin having a lower refractive index than that of the on-chip lens and low-refractive-index particles having a lower refractive index than that of the binder resin.

24 Claims, 19 Drawing Sheets

(56) References Cited

FOREIGN PATENT DOCUMENTS

| | | |
|---|---|---|
| JP | 10-270672 | 10/1998 |
| JP | 2002-261261 | 9/2002 |
| JP | 2003-258224 | 9/2003 |
| JP | 2004-333901 | 11/2004 |
| JP | 2006261238 | 9/2006 |
| JP | 2006-332433 | 12/2006 |
| JP | 2007-019435 | 1/2007 |
| JP | 2007-053324 | 3/2007 |
| JP | 2007-067384 | 3/2007 |
| JP | 2008-030464 | 2/2008 |
| JP | 2008-066679 | 3/2008 |
| JP | 2008060464 A * | 3/2008 |

OTHER PUBLICATIONS

Extended European Search Report for European Patent Application No. 13003981.1 dated Sep. 24, 2013, 11 pages.

European Search Report corresponding to European No. 10004019.5 dated Sep. 24, 2010.

* cited by examiner

FIG. 2
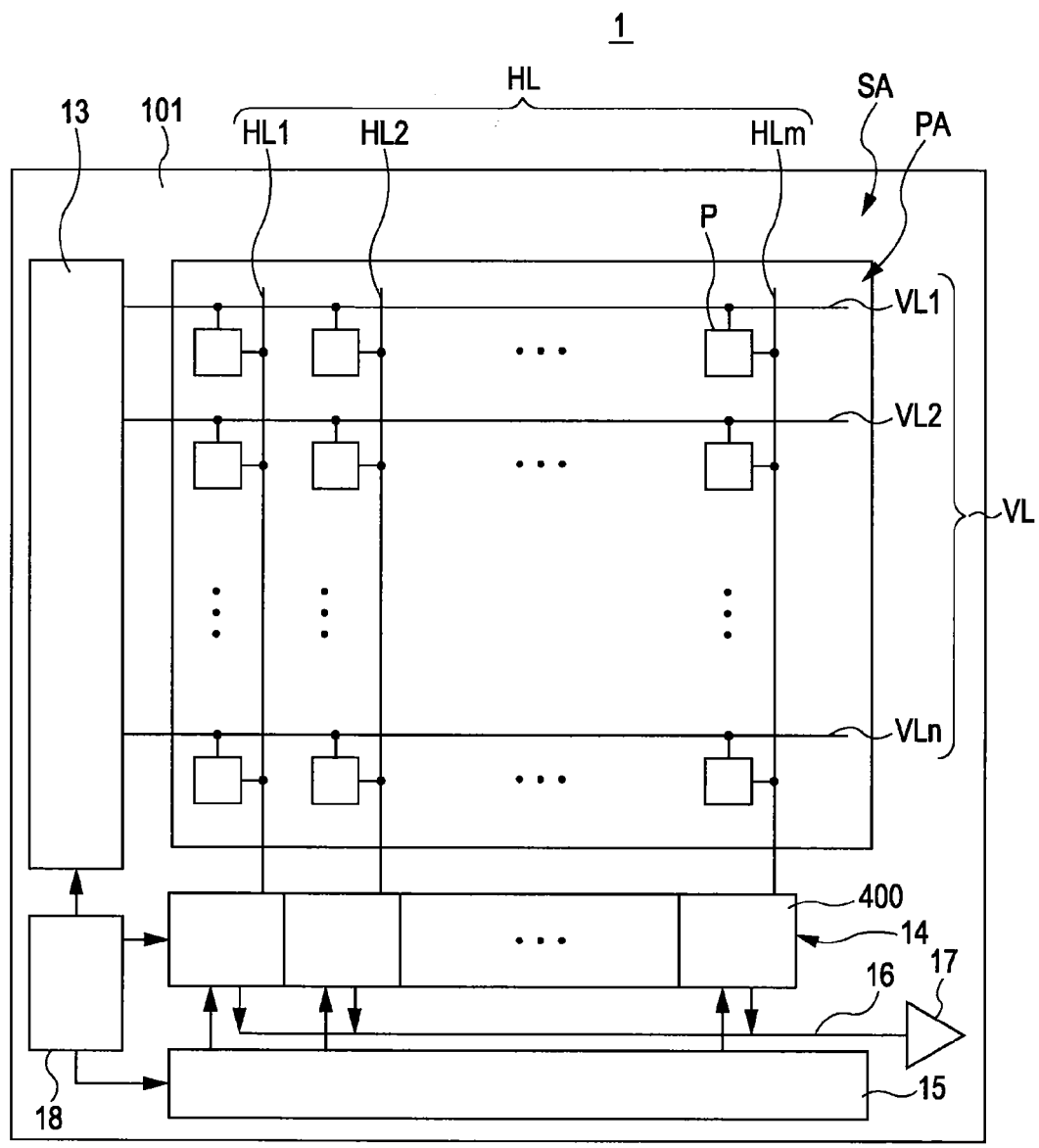
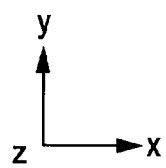

SOLID-STATE IMAGE CAPTURE DEVICE, MANUFACTURING METHOD THEREFOR, AND ELECTRONIC APPARATUS

RELATED APPLICATION DATA

This application is a division of U.S. patent application Ser. No. 12/765,455, filed Apr. 22, 2010, the entirety of which is incorporated herein by reference to the extent permitted by law. The present application also claims priority to Japanese Priority Patent Application No. JP2009-117401 filed May 14, 2009, the entirety of which is incorporated by reference herein to the extent permitted by law.

FIELD OF THE INVENTION

The present invention relates to a solid-state image capture device, a manufacturing method therefor, and an electronic apparatus. In particular, the present invention relates to a solid-state image capture device having a photoelectric converter that receives light at a light-receiving surface and photoelectrically converts the received light to thereby generate signal charge, a manufacturing method for the solid-state image capture device, and an electronic apparatus.

DESCRIPTION OF THE RELATED ART

Electronic apparatuses, such as digital video cameras and digital still cameras, include solid-state image capture devices. Examples of the solid-state image capture devices include CMOS (complementary metal oxide semiconductor) image sensors and CCD (charge coupled device) image sensors.

In the solid-state image capture device, an image capture area having multiple pixels is provided on a surface of a semiconductor substrate. In the image capture area, multiple photoelectric converters are formed so as to correspond to the multiple pixels. The photoelectric converters receive light of a subject image and photoelectrically convert the received light to thereby generate signal charge. For example, photodiodes are formed as the photoelectric converters.

In such solid-state image capture devices, the cell sizes of the pixels have been reduced in conjunction with an increase in the number of pixels. As a result, there are cases in which the amount of light received per pixel decreases and the sensitivity declines.

Thus, in order to enhance the light focusing efficiency and to improve the sensitivity, on-chip lenses are formed so as to correspond to the pixels.

An antireflection layer is further formed on the surface of the on-chip lenses to prevent a decrease in the image quality of captured images, the decrease being caused by flare, ghost, or the like.

For example, it has been proposed to form a porous film as the antireflection layer so that the film thickness thereof becomes one-fourth the wavelength $\lambda$ of reflection light (i.e., $\lambda/4$). For example, it has also been proposed to form the antireflection layer by using a material having a low refractive index than the on-chip lenses. Reference is made to, for example, Japanese Unexamined Patent Application Publication Nos. 2002-261261, 2003-258224, 2008-66679, 2006-332433, and 10-270672.

In order to overcome the above-described problem, it has also been proposed to form the on-chip lenses using a binder resin containing minute particles. Reference is made to, for example, Japanese Unexamined Patent Application Publication No. 2008-30464.

SUMMARY OF THE INVENTION

In the above-described configurations, there are cases in which it is difficult to sufficiently enhance the light focusing efficiency, resulting in an insufficient improvement in the sensitivity. Consequently, the image quality of captured images may decrease. There are also cases in which it is difficult to sufficiently suppress generation of flare, ghost, and so on, resulting in a decrease in the image quality of captured images.

In order to overcome the problems, an approach in which the on-chip lenses are formed with an increased curvature thereof is conceivable. However, such an approach may cause problems, such as an increase in complexity in the manufacturing process and an increase in the manufacturing cost.

Thus, there are cases in which it is difficult to improve the image quality of captured images and it is difficult to improve the manufacturing efficiency.

Accordingly, it is desirable to provide a solid-state image capture device, a manufacturing method therefor, and an electronic apparatus which are capable of improving the image quality of captured images and are capable of improving the manufacturing efficiency.

A solid-state image capture device according to an embodiment of the present invention includes: at least one photoelectric converter provided at an image capture surface of a substrate to receive incident light at a light-receiving surface of the photoelectric converter and photoelectrically convert the incident light to thereby generate signal charge; at least one on-chip lens provided at the image capture surface of the substrate and above the light-receiving surface of the photoelectric converter to focus the incident light onto the light-receiving surface; and an antireflection layer provided on an upper surface of the on-chip lens at the image capture surface of the substrate. The antireflection layer contains a binder resin having a lower refractive index than the on-chip lens and low-refractive-index particles having a lower refractive index than the binder resin.

A solid-state image capture device according to another embodiment of the present invention includes: a photoelectric converter provided in an image capture area of a substrate to receive incident light at a light-receiving surface of the photoelectric converter and photoelectrically convert the incident light to thereby generate signal charge; and an on-chip lens provided in the image capture area of the substrate and above the light-receiving surface of the photoelectric converter to focus the incident light onto the light-receiving surface. The on-chip lens contains a binder resin and low-refractive-index particles having a lower refractive index than the binder resin.

An electronic apparatus according to another embodiment of the present invention includes: a photoelectric converter provided at an image capture surface of a substrate to receive incident light at a light-receiving surface of the photoelectric converter and photoelectrically convert the incident light to thereby generate signal charge; an on-chip lens provided at the image capture surface of the substrate and above the light-receiving surface of the photoelectric converter to focus the incident light onto the light-receiving surface; and an antireflection layer provided on an upper surface of the on-chip lens at the image capture surface of the substrate. The antireflection layer contains a binder resin having a lower refractive index than the on-chip lens and low-refractive-index particles having a lower refractive index than the binder resin.

An electronic apparatus according to still another embodiment of the present invention includes: a photoelectric converter provided in an image capture area of a substrate to receive incident light at a light-receiving surface of the photoelectric converter and photoelectrically convert the incident light to thereby generate signal charge; and an on-chip lens provided in the image capture area of the substrate and above the light-receiving surface of the photoelectric converter to focus the incident light onto the light-receiving surface. The on-chip lens contains a binder resin and low-refractive-index particles having a lower refractive index than the binder resin.

A manufacturing method for a solid-state image capture device according to an embodiment of the present invention includes the steps of: providing a photoelectric converter at an image capture surface of a substrate, the photoelectric converter receiving incident light at a light-receiving surface of the photoelectric converter and photoelectrically converting the incident light to thereby generate signal charge; providing an on-chip lens above the light-receiving surface of the photoelectric converter, the on-chip lens focusing the incident light onto the light-receiving surface; and providing an antireflection layer on an upper surface of the on-chip lens. The antireflection layer contains a binder resin having a lower refractive index than the on-chip lens and low-refractive-index particles having a lower refractive index than the binder resin.

A manufacturing method for a solid-state image capture device according to another embodiment of the present invention includes the steps of: providing a photoelectric converter at an image capture surface of a substrate, the photoelectric converter receiving incident light at a light-receiving surface of the photoelectric converter and photoelectrically converting the incident light to thereby generate signal charge; and providing an on-chip lens above the light-receiving surface of the photoelectric converter, the on-chip lens focusing the incident light onto the light-receiving surface. The on-chip lens contains a binder resin and low-refractive-index particles having a lower refractive index than the binder resin.

According to the present invention, the antireflection layer is formed using a binder resin having a lower refractive index than the on-chip lens and low-refractive-index particles having a lower refractive index than the binder resin. Alternatively, the on-chip lens is formed using a binder resin and low-refractive-index particles having a lower refractive index than the binder resin. Thus, it is possible to reduce ripple due to a phase difference using the curvature of the low-refractive-index particles.

According to the present invention, it is possible to provide a solid-state image capture device, a manufacturing method therefor, and an electronic apparatus which are capable of improving the image quality of captured images and are capable of improving the manufacturing efficiency.

BRIEF DESCRIPTION OF THE DRAWINGS

FIG. 2 is a schematic diagram showing the configuration of a solid-state image capture device according to the embodiment of the present invention;

DESCRIPTION OF THE PREFERRED EMBODIMENTS

Embodiments of the present invention will be described below with reference to the accompanying drawings.

Descriptions are given below in the following order:
1. First Embodiment (When Film Thickness of Antireflection Layer is Uniform)
2. Second Embodiment (When Film Thickness of Antireflection Layer is Larger at Concave Portion of OCL than Convex Portion)
3. Third Embodiment (When Surface of Antireflection Layer is Flat)
4. Fourth Embodiment (When Antireflection Layer has Multiple Layers)
5. Fifth Embodiment (When OCL contains Low-Refractive-Index Particles)
6. Modifications

1. First Embodiment

When Film Thickness of Antireflection Layer is Uniform

[A] Device Configuration (1) Configuration of Major Portion of Camera

Figure 1:
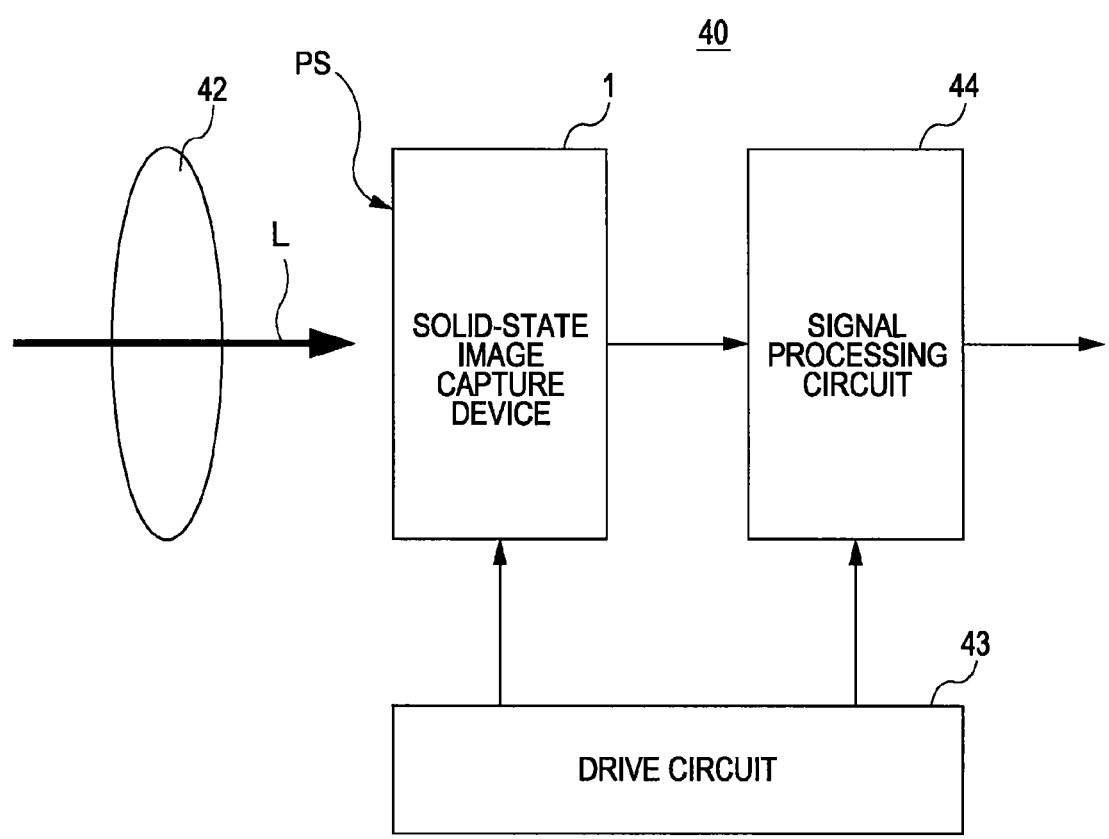
FIG. 1 is a block diagram showing the configuration of a camera according to a first embodiment of the present invention.

FIG. 1 is a block diagram showing the configuration of a camera 40 according to a first embodiment of the present invention.

As shown in FIG. 1, the camera 40 includes a solid-state image capture device 1, an optical system 42, a drive circuit 43, and a signal processing circuit 44. The portions included in the camera 40 are sequentially described below.

Incident light (of a subject image) L entering through the optical system 42 is received by an image-capture surface PS of the solid-state image capture device 1. The solid-state image capture device 1 then photoelectrically converts the received light to generate signal electric charge. The solid-state image capture device 1 performs driving on the basis of a drive signal output from the drive circuit 43. Specifically, the solid-state image capture device 1 reads the signal electric charge and outputs it as raw data.

The optical system 42 is disposed so as to focus the incident light L of the subject image onto the image capture surface PS of the solid-state image capture device 1.

The drive circuit 43 outputs various drive signals to the solid-state image capture device 1 and the signal processing circuit 44 to drive the solid-state image capture device 1 and the signal processing circuit 44.

The signal processing circuit 44 is configured to perform signal processing on the data, output from the solid-state image capture device 1, to generate a digital image of the subject image.

(2) Configuration of Major Portion of Solid-State Image Capture Device

An overall configuration of the solid-state image capture device 1 will be described below.

FIG. 2 is a schematic diagram showing the configuration of the solid-state image capture device 1 according to the embodiment of the present invention.

The solid-state image capture device 1 according to the present embodiment may be implemented by a CMOS color image sensor, and includes a substrate 101 as shown in FIG. 2. The substrate 101 is, for example, a silicon-based semiconductor substrate, and has a surface provided with an image capture area PA and a peripheral area SA, as shown in FIG. 2.

(2-1) Image Capture Area PA

The image capture area PA will now be described.

As shown in FIG. 2, the image capture area PA has a rectangular shape and has multiple pixels P arranged in a horizontal direction x and a vertical direction y. That is, the pixels P are arranged in a matrix.

More specifically, as shown in FIG. 2, the pixels P are arranged in such a manner that m pixels and n pixels are arranged in the horizontal direction x and the vertical direction y, respectively. That is, the multiple pixels P are arranged so as to have a pixel array of m columns and n rows. A detailed configuration of the pixels P is described below.

The image capture area PA has row control lines VL. The row control lines VL are electrically connected to the corresponding pixels P arranged in the image capture area PA in the horizontal direction x. The row control lines VL are arranged in parallel with each other in the vertical direction y so as to correspond to the pixels P arranged in the vertical direction y. That is, the row control lines VL include a first row control line VL1 to an nth row control line VLn, which are wired so as to correspond to the respective rows (the first to nth rows) of the pixels P provided in the image capture area PA.

The image capture area PA also has column signal lines HL. The column signal lines HL are electrically connected to the corresponding pixels P arranged in the image capture area PA in the vertical direction y. The column signal lines HL are arranged in parallel with each other in the horizontal direction x so as to correspond to the pixels P arranged in the horizontal direction x. That is, the column signal lines HL include a first column signal line HL1 to an mth column signal line HLm, which are wired so as to correspond to the respective columns (the first to mth columns) of the pixels P provided in the image capture area PA.

Figure 3:
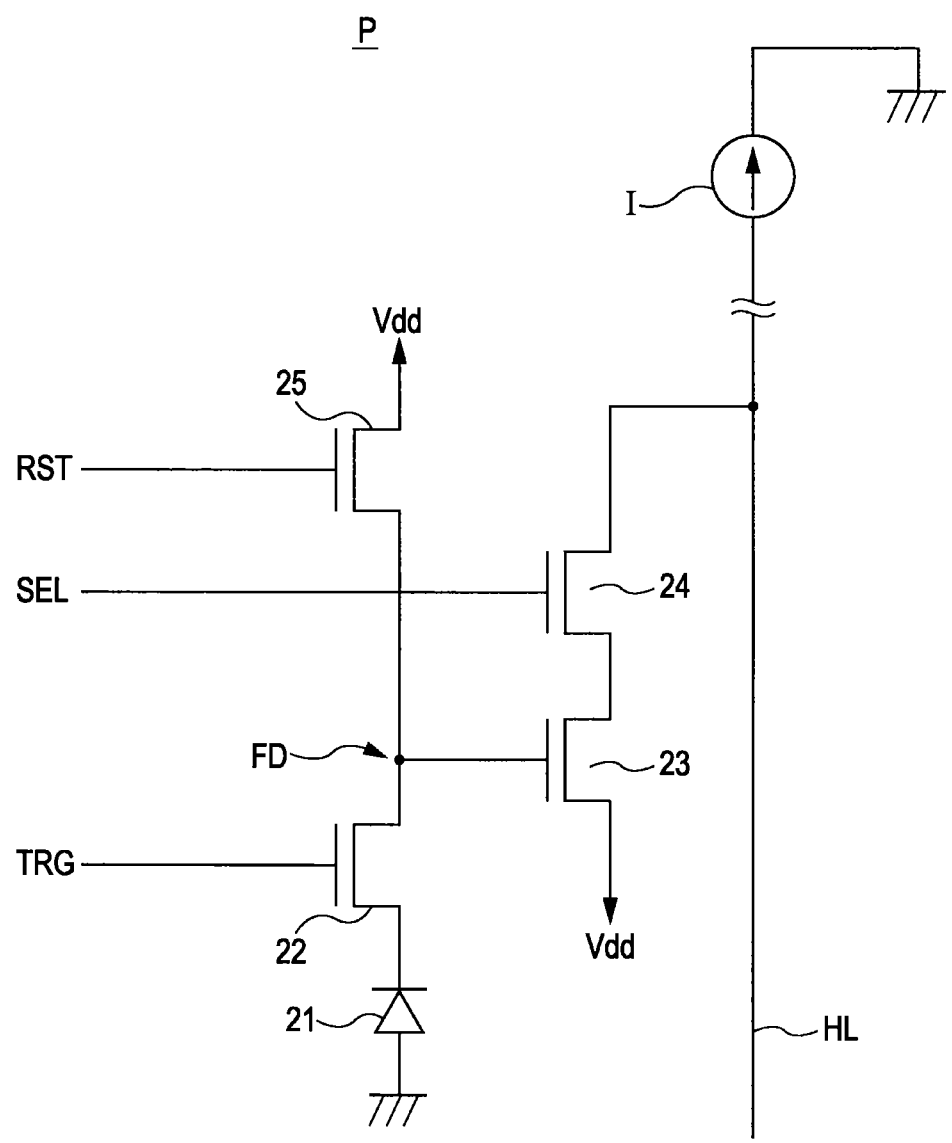
FIG. 3 is a circuit diagram showing a major portion of a pixel provided in an image-capture area in the embodiment of the present invention.

FIG. 3 is a circuit diagram showing a major portion of the pixels P provided in the image capture area PA in the embodiment of the present invention.

As shown in FIG. 3, each of the pixels P provided in the image capture area PA includes a photodiode 21, a transfer transistor 22, an amplifying transistor 23, a selecting transistor 24, and a reset transistor 25. That is, the pixel P has a photodiode 21 and pixel transistors for performing operation for reading signal charge from the photodiode 21.

In the pixel P, the photodiode 21 receives light of a subject image, photoelectrically converts the received light to generate signal charge, and stores the signal charge. As shown in FIG. 3, the photodiode 21 is connected to a floating diffusion FD via the transfer transistor 22. The transfer transistor 22 transfers the signal charge, stored in the photodiode 21, as an output signal.

As shown in FIG. 3, in the pixel P, the transfer transistor 22 is provided between the photodiode 21 and the floating diffusion FD. Upon application of a transfer pulse TRG to a gate of the transfer transistor 22, the transfer transistor 22 transfers the signal charge, stored in the photodiode 21, to the floating diffusion FD as an output signal.

As shown in FIG. 3, in the pixel P, the amplifying transistor 23 has a gate connected to the floating diffusion FD so as to amplify the output signal output via the floating diffusion FD. The amplifying transistor 23 is connected to the column signal line HL via the selecting transistor 24. When the selecting transistor 24 is turned on, the amplifying transistor 23 forms a source follower in conjunction with a constant current source I connected to the column signal line HL.

In the pixel P, as shown in FIG. 3, the selecting transistor 24 is configured so that a selection pulse SEL is supplied to a gate of the selecting transistor 24. The selecting transistor 24 serves to select, for each row, a pixel for reading of a signal. Upon supply of the selection pulse SEL, the selecting transistor 24 is turned on. When the selecting transistor 24 is turned on, the amplifying transistor 23 and the constant current source I form a source follower, as described above, so that a voltage corresponding to a voltage of the floating diffusion FD is output to the column signal line HL.

As shown in FIG. 3, in the pixel P, the reset transistor 25 is configured so that a reset pulse RST is supplied to a gate of the reset transistor 25. The reset transistor 25 is connected between a power supply Vdd and the floating diffusion FD. Upon supply of the reset pulse RST to the gate of the reset transistor 25, the reset transistor 25 resets the potential of the floating diffusion FD to the potential of the power supply Vdd.

Peripheral circuits, which are described below, are provided in a peripheral area SA. Various pulsed signals are supplied from the peripheral circuits to the pixels P through the row control lines VL, so that the pixels P are sequentially selected and driven for each horizontal line (i.e., for each pixel row).

(2-2) Peripheral Area

The peripheral area SA will now be described.

As shown in FIG. 2, the peripheral area SA is provided around the image capture area PA.

The peripheral circuits provided in the peripheral area SA process the signal charge generated by the pixels P. The peripheral circuits include, for example, a row scan circuit 13, a column circuit 14, a column scan circuit 15, an output circuit 17, and a timing control circuit 18.

The row scan circuit 13 includes a shift register (not shown) so as to select and drive the pixels P for each row. As shown in FIG. 2, one end of each of the row control lines VL is electrically connected to the row scan circuit 13. The row scan circuit 13 scans the pixels P, disposed in the image capture area PA, for each row via the corresponding row control lines VL. More specifically, the row scan circuit 13 outputs, for each row, various pulsed signals, such as a reset pulse signal and a transfer pulse signal, to the pixels P through the column control lines VL to thereby drive the pixels P.

One end of each of the column signal lines HL is electrically connected to the column circuit 14. The column circuit 14 is configured so as to perform signal processing on the signals read from the pixels P for each column. The column circuit 14 has ADCs (analog-to-digital converters) 400, which perform analog-to-digital conversion operation for converting analog signals, output from the pixels P, into digital signals. More specifically, the ADCs 400 are disposed in parallel with each other in the horizontal direction x so as to correspond to the columns of the pixels P arranged in the horizontal direction x in the image capture area PA. The ADCs 400 are electrically connected to the column signal lines HL provided for the corresponding columns of the pixels P, and perform analog-to-digital conversion operation on signals output from the corresponding columns of the pixels P.

The column scan circuit 15 includes a shift register (not shown). The column scan circuit 15 is configured to select the columns of the pixels P and to output digital signals from the column circuit 14 to a horizontal output line 16. As shown in FIG. 2, the column scan circuit 15 is electrically connected to the ADCs 400 included in the column circuit 14. Signals read from the pixels P via the column circuit 14 are sequentially output to the horizontal output line 16 in the horizontal direction x.

The output circuit 17 includes, for example, an amplifier (not shown). The output circuit 17 executes signal processing, such as amplification processing, on the digital signals output from the column scan circuit 15, and outputs the resulting digital signals.

The timing control circuit 18 generates various timing signals, and outputs the timing signals to the row scan circuit 13, the column circuit 14, and the column scan circuit 15 to thereby drive and control the circuits 13, 14, and 15.

(3) Detailed Configuration of Solid-State Image Capture Device

Details of the solid-state image capture device 1 according to the present embodiment will now be described.

Figure 4:
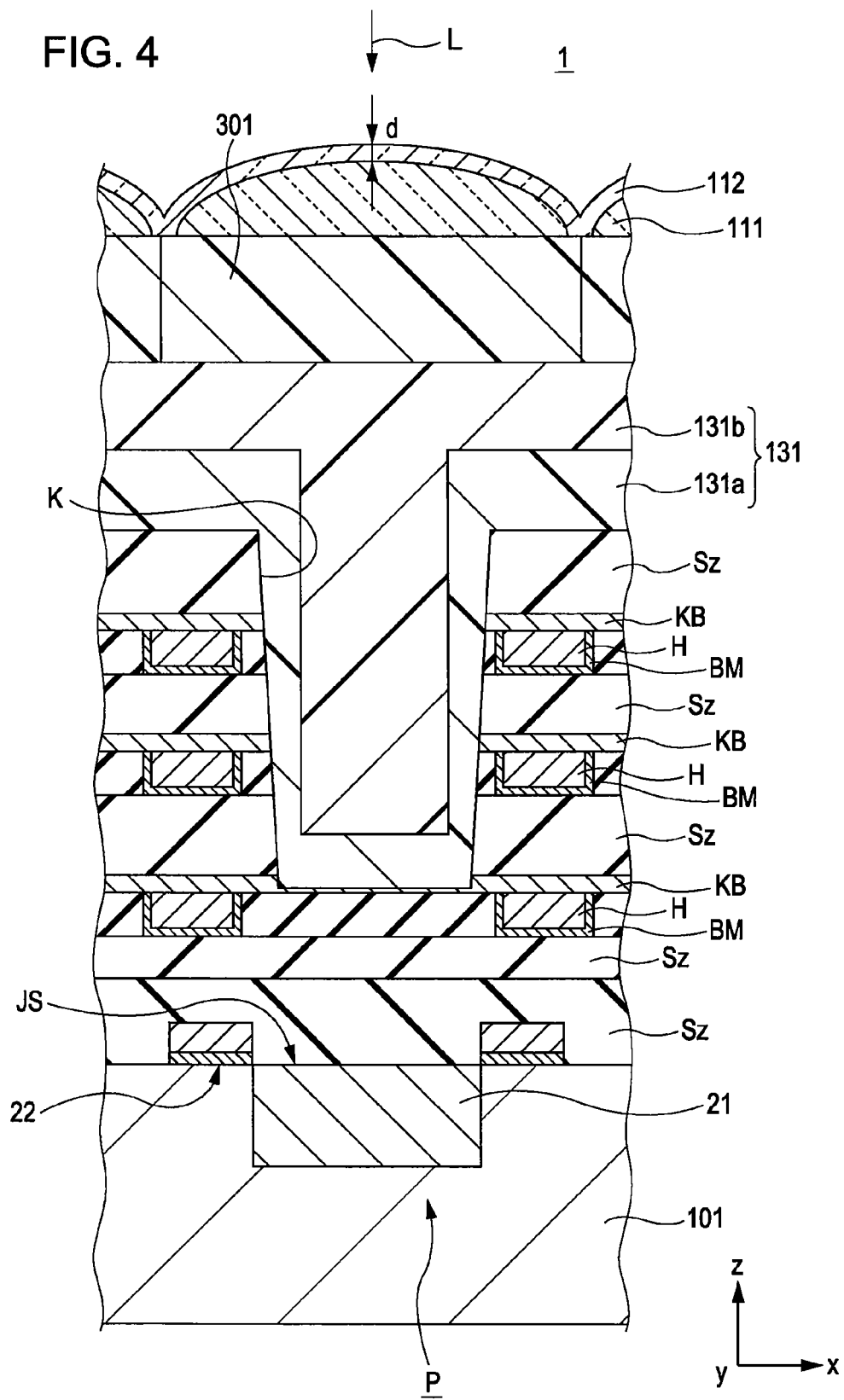
FIG. 4 is a view showing a major portion of the solid-state image capture device according to the first embodiment of the present invention.

FIG. 4 is a schematic view showing a major portion of the solid-state image capture device 1 according to the first embodiment of the present invention. FIG. 4 shows a cross section of the pixel P provided in the image capture area PA. While the image capture area PA has the pixels P arranged at the substrate 101 in the manner described above, illustration except for the major portion thereof is omitted.

As shown in FIG. 4, the solid-state image capture device 1 has a configuration in which a photodiode 21, an on-chip lens (OCL) 111, an antireflection layer 112, an optical-waveguide core portion 131, and a color filter 301 are provided at and above the substrate 101 so as to correspond to the pixel P.

The portions included in the solid-state image capture device 1 will now be described in order.

(3-1) Photodiode 21

As shown in FIG. 4, the photodiode 21 is provided in the substrate 101. The photodiode 21 is configured so that it receives incident light L at a light-receiving surface JS and photoelectrically converts the incident light L to generate signal electric charge.

As shown in FIG. 4, the on-chip lens 111, the antireflection layer 112, the optical-waveguide core portion 131, and the color filter 301 are disposed above the light-receiving surface JS of the photodiode 21. The optical-waveguide core portion 131, the color filter 301, the on-chip lens 111, and the antireflection layer 112 are arranged above the photodiode 21 in that order from the light-receiving surface JS side. Thus, in the present embodiment, the light-receiving surface JS of the photodiode 21 receives the incident light L entering through the above-described portions, and the photodiode 21 generates signal charge. The transfer transistor 22 is provided on the substrate 101 so as to be adjacent to the photodiode 21.

(3-2) On-Chip Lens 111

The on-chip lens 111 is the so-called "microlens". As shown in FIG. 4, the on-chip lens 111 is provided above the light-receiving surface JS of the substrate 101 so as to focus the incident light L onto the light-receiving surface JS.

The on-chip lens 111 is a convex lens that protrudes upward in a convex shape from the light-receiving surface JS. That is, the on-chip lens 111 is formed such that the center thereof is thicker than the edge thereof in a direction from the light-receiving surface JS of the photodiode 21 toward the optical-waveguide core portion 131.

The on-chip lens 111 opposes the light-receiving surface JS of the photodiode 21 in a depth direction z of the substrate 101, with the color filter 301 and the optical-waveguide core portion 131 being interposed between the on-chip lens 111 and the photodiode 21. Thus, the light-receiving surface JS of the photodiode 21 receives light, focused by the on-chip lens 111, through the color filter 301 and the optical-waveguide core portion 131.

In the present embodiment, multiple on-chip lenses 111 are disposed so as to correspond to the multiple photodiodes 21. The on-chip lenses 111 have spaces therebetween.

The on-chip lenses 111 are formed using a transparent resin, such as a styrene resin.

(3-3) Antireflection Layer 112

As shown in FIG. 4, the antireflection layer 112 covers the upper surfaces of the on-chip lenses 111 so as to prevent reflection of the incident light L on the upper surfaces of the on-chip lenses 111.

Figure 5:
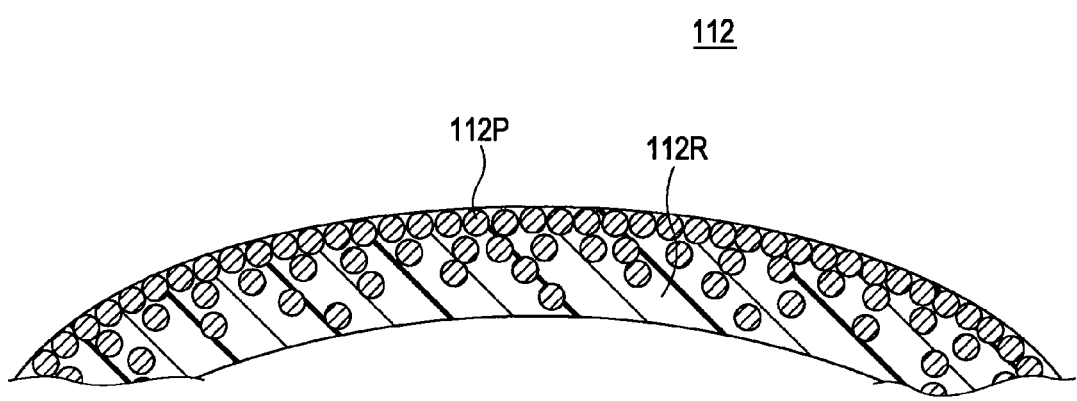
FIG. 5 is a view showing a portion including an antireflection layer in the solid-state image capture device according to the first embodiment of the present invention.

FIG. 5 is an enlarged cross sectional view schematically showing a portion including the antireflection layer 112 in the solid-state image capture device 1 according to the first embodiment of the present invention. Since FIG. 5 is a schematic conceptual view, the scales illustrated are different from actual dimensions.

As shown in FIG. 5, the antireflection layer 112 is formed using low-refractive-index particles 112P and a binder resin 112R.

As the binder resin 112R, a material having a lower refractive index than the on-chip lens 111 is used. As the low-refractive-index particles 112P, particles having a lower refractive index than the binder resin 112R are used.

As shown in FIG. 5, the antireflection layer 112 is formed above the light-receiving surface JS such that more low-refractive-index particles 112P are distributed than the binder resin 112R as the distance from the light-receiving surface JS increases.

In this case, as the low-refractive-index particles 112P, it is preferable to use hollow inorganic particles having voids therein, for example, hollow silica particles (the refractive index n=about 1.25 to 1.40). This is because hollow particles, such as hollow silica particles, contain air (the reflective index n=1) therein and have a low refractive index.

It is preferable that particles having voids therein and having a low specific gravity, like hollow silica particles, be used as the low-refractive-index particles. Examples of such particles include inorganic material, such as titania, alumina, and zirconia. Alternatively, organic materials having voids therein and having a low specific gravity can also be used.

As the hollow silica particles, particles having an average particle size in the range of 20 to 100 nm can preferably be used. When the particle size exceeds the range, problems, such as deterioration of the preservation stability and generation of voids in the formed film, can occur. On the other hand, when the average particle size is below the range, problems such as difficulty in using a material having a low refractive index may arise.

As the binder resin 112R, it is preferable to use, for example, a polysiloxane resin (the refractive index n=about 1.5). Alternatively, it is preferable to use an acrylic resin or the like.

It is preferable that the low-refractive-index particles 112P be contained in the antireflection layer 112 to constitute 10% to 50% by weight. When this range is exceeded, there may be cases in which voids are generated in the film and the preservation stability decreases. On the other hand, when the range is not reached, problems such as difficulty in using a material having a low refractive index may arise.

In the present embodiment, the antireflection layer 112 is provided on the upper surfaces of the on-chip lenses 111 so that a film thickness d of the antireflection layer 112 becomes uniform.

More specifically, it is preferable to form the antireflection layer 112 so that the film thickness d becomes one-fourth the wavelength λ of reflection light, that is, the film thickness d becomes λ/4. With this arrangement, since reflection light reflected after entering the antireflection layer 112 has a phase shifted from the incident light, the reflection light and light that enters the antireflection layer 112 cancel each other out. This makes it possible to preferably provide an antireflection function.

(3-4) Optical-Waveguide Core portion 131

As shown in FIG. 4, the optical-waveguide core portion 131 is provided above the surface of the substrate 101 so as to guide the incident light to the light-receiving surface JS of the photodiode 21.

As shown in FIG. 4, the optical-waveguide core portion 131 is provided between the color filter 301 and the light-receiving surface JS of the photodiode 21. The optical-waveguide core portion 131 guides light, transmitted sequentially through the on-chip lens 111 and the color filter 301, to the light-receiving surface JS of the photodiode 21.

As shown in FIG. 4, the optical-waveguide core portion 131 is shaped so that the area of a plane along the light-receiving surface JS of the photodiode 21 decreases in a direction from the on-chip lens 111 toward the photodiode 21. That is, the optical-waveguide core portion 131 is formed to have a tapered shape.

As shown in FIG. 4, the optical-waveguide core portion 131 has a side surface and a bottom surface which are covered by inter-layer insulating layers Sz that serve as cladding. As shown in FIG. 4, the inter-layer insulating layers Sz are located at the side-surface portion of the optical-waveguide core portion 131 and include multiple wiring lines H. The wiring line H is formed by forming a groove therefor in the inter-layer insulating layer Sz, forming a barrier metal layer BM on the surface of the groove, and filling the groove with a conductive material such as copper. In order to prevent diffusion of copper contained in the wiring lines H, an anti-diffusion layer KB is provided between the corresponding inter-layer insulating layers Sz.

In the present embodiment, as shown in FIG. 4, the optical-waveguide core portion 131 includes a first core portion 131a and a second core portion 131b.

As shown in FIG. 4, the first core portion 131a of the optical-waveguide core portion 131 is formed on the surface of a hole K, which is formed by removing a portion of the inter-layer insulating layers Sz, and on the uppermost surface of the inter-layer insulating layers Sz. The first core portion 131a functions as a passivation film. The first core portion 131a is formed of an optical material having a higher refractive index than the inter-layer insulating layers Sz serving as cladding. The first core portion 131a is also formed of an optical material having a higher refractive index than the second core portion 131b provided inside the first core portion 131a. For example, the inter-layer insulating layers Sz are formed by silicon oxide films. The first core portion 131a is formed by depositing a silicon nitride (SiN) film by plasma CVD (chemical vapor deposition) so that the refractive index becomes higher than that of the inter-layer insulating layers Sz. In addition, it is preferable that the first core portion 131a be formed by a photoresist film, a titanium oxide film, or a plasma silicon oxynitride (SiON) film deposited by plasma CVD.

As shown in FIG. 4, the second core portion 131b in the optical-waveguide core portion 131 is an embedded layer and is embedded in the first core portion 131a. The second core portion 131b is formed by filling the hole K, formed by removing the portion of the inter-layer insulating layers Sz, with an optical material with the first core portion 131a interposed between the hole K and the second core portion 131b. The second core portion 131b is provided above the uppermost surface of the inter-layer insulating layers Sz with the first core portion 131a interposed therebetween. A surface of the second core portion 131b is planarized. The second core portion 131b is formed using an optical material having a smaller refractive index than the first core portion 131a. For example, the second core portion 131b is formed by depositing an acrylic resin by spin coating. Alternatively, the second core portion 131b is formed using, preferably, a polyimide resin, a $Si_3N_4$ (silicon nitride) film, a DLC (diamond like carbon) film, or a polysiloxane resin.

(3-5) Color Filter 301

As shown in FIG. 4, the color filter 301 is disposed above the surface of the substrate 101 so as to oppose the light-receiving surface JS and is configured so that the incident light L is colored and is transmitted to the light-receiving surface JS.

As shown in FIG. 4, the color filter 301 is provided on the second core portion 131b included in the optical-waveguide core portion 131.

More specifically, coating fluid containing a pigment and a photosensitive resin is applied by spin coating or the like to form a coated film, and the coated film is subjected to patterning by a lithographic technique, to thereby form the color filter 301. For example, similarly to the second core portion 131b, the color filter 301 is formed using an acrylic resin as a photosensitive resin. Since both of the color filter 301 and the second core portion 131b are formed using an acrylic resin, they are preferably formed in close contact with each other.

Although not shown, the color filter 301 includes three-primary-color filter layers, i.e., a green-filter layer, a red-filter layer, and a blue-filter layer, which are provided so as to correspond to the pixels P. For example, the green filter layer, the red filter layer, and the blue filter layer are arranged in a Bayer arrangement so as to correspond to the respective pixels P.

[B] Manufacturing Method

A method for manufacturing the above-described solid-state image capture device 1 will be described below.

FIGS. 6 to 11 show a major portion provided by processes of a method for manufacturing the solid-state image capture device 1 according to the first embodiment of the present invention. FIGS. 6 to 11 illustrate cross sections of a portion that is similar to the portion shown in FIG. 4.

(1) Formation of Photodiode 21, Etc.

Figure 6:
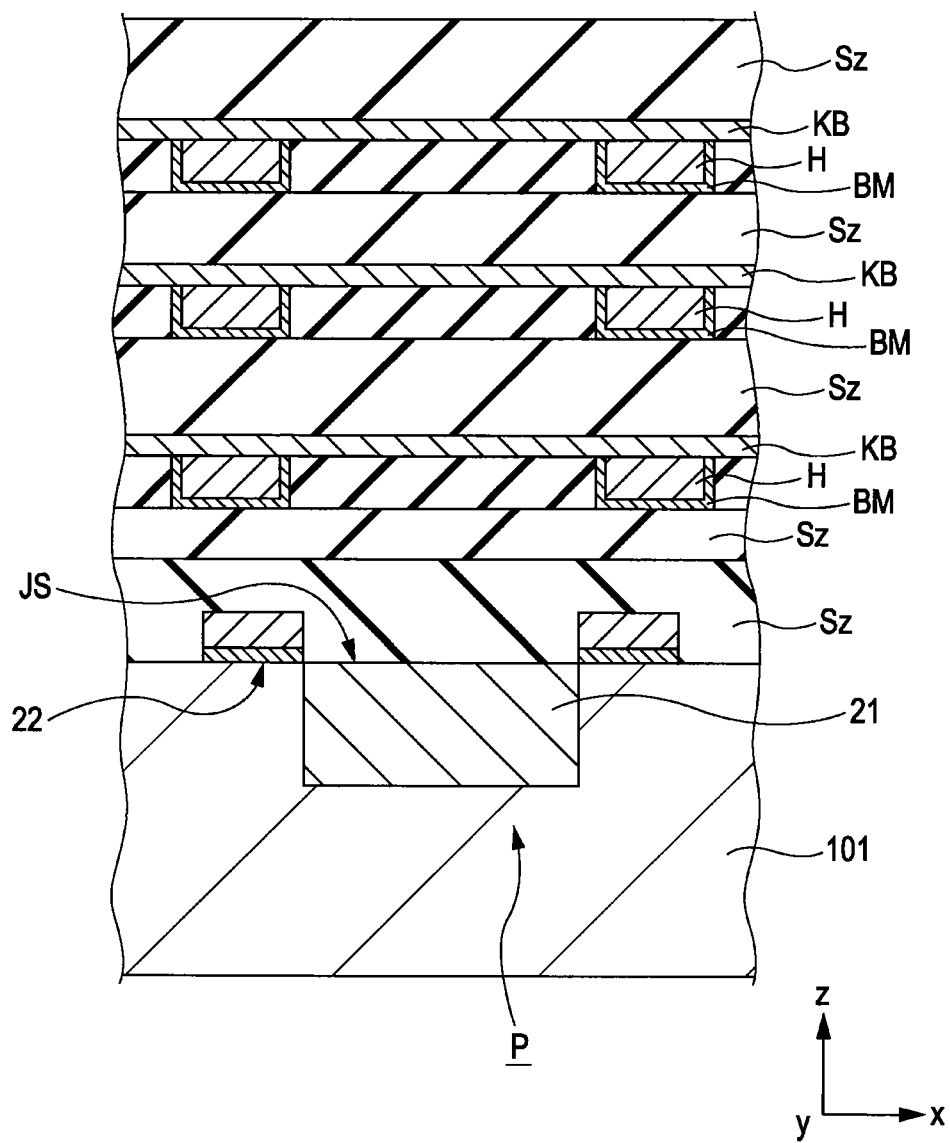
FIG. 6 is a view showing a major portion provided in processes of a method for manufacturing the solid-state image capture device according to the first embodiment of the present invention.

First, portions including the photodiode 21 are formed as shown in FIG. 6.

For example, the photodiode 21 is formed by ion-implanting an n-type impurity into the substrate 101, which is a p-type silicon substrate.

Thereafter, portions, such as the transfer transistor 22, that constitute the pixel P are formed.

Subsequently, multiple inter-layer insulating layers Sz are formed above the surface of the substrate 101 so as to cover the photodiode 21. For example, the inter-layer insulating layers Sz are formed by depositing silicon oxide films by CVD.

During the formation of the inter-layer insulating layers Sz, wiring lines H are formed between the inter-layer insulating layers Sz by, for example, a damascene process.

The wiring line H is formed by forming a groove therefor in the inter-layer insulating layer Sz, forming a barrier metal layer BM on the surface of the groove, and filling the groove with a conductive material such as copper. For example, the barrier metal layer BM is formed by sequentially depositing tantalum films and tantalum nitride films by sputtering. For example, the wiring line H is formed by forming a copper seed layer (not shown), depositing a copper film by performing electrolytic plating processing, and planarizing the surface of the copper film by CMP (chemical mechanical polishing).

In order to prevent diffusion of copper contained in the wiring lines H, an anti-diffusion layer KB is provided between the corresponding inter-layer insulating layers Sz. For example, the anti-diffusion layer KB is formed as a layer on the wiring line H by depositing a silicon carbide film by CVD.

(2) Formation of Hole K

Figure 7:
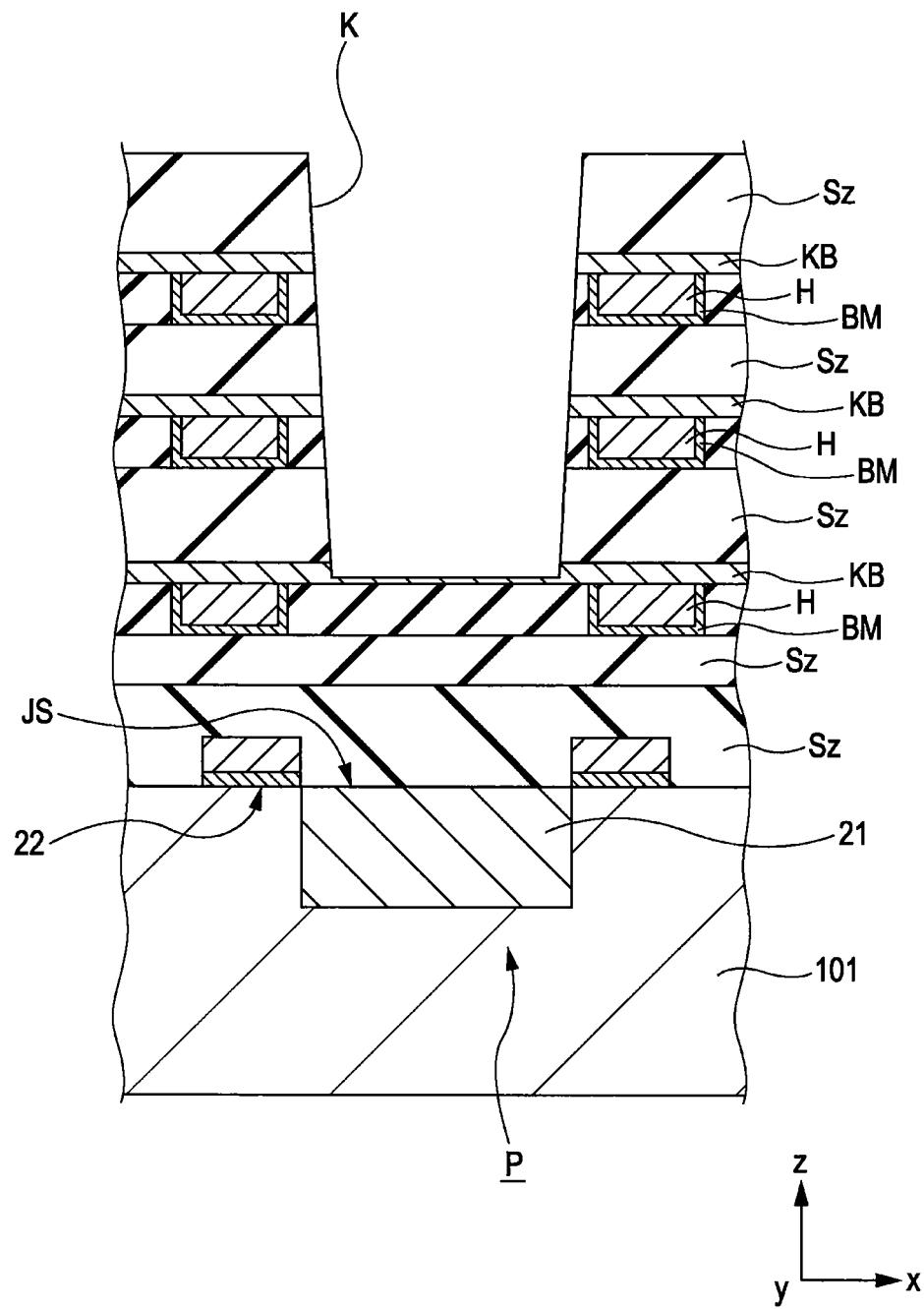
FIG. 7 is a view showing the major portion provided in the processes of the method for manufacturing the solid-state image capture device according to the first embodiment of the present invention.

Next, the hole K is formed as shown in FIG. 7.

In this case, the hole K is formed by removing a portion of the inter-layer insulating layers Sz by etching.

More specifically, as shown in FIG. 7, a portion of the inter-layer insulating layers Sz and so on, the portion corresponding to the center portion of the light-receiving surface JS of the photodiode 21, is etched. In the present embodiment, the hole K is formed such that, in the hole K, the area of the plane along the light-receiving surface JS increases sequentially upward from the light-receiving surface JS. That is, the hole K is formed to have a tapered shape such that the side surface of the hole K is slanted in the z direction perpendicular to the light-receiving surface JS. The hole K is formed by performing, for example, anisotropic etching, such as dry etching.

Figure 8:
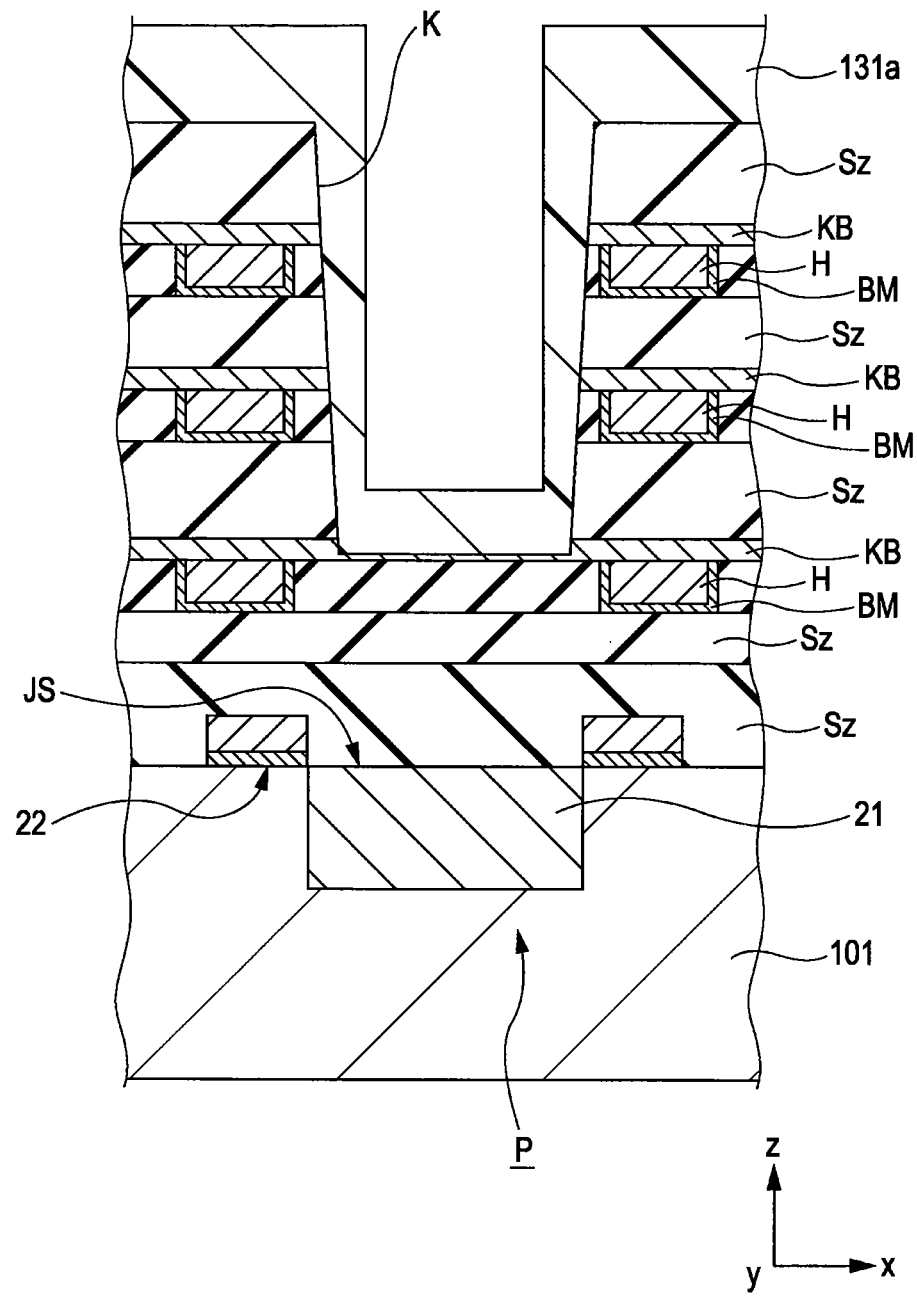
FIG. 8 is a view showing the major portion provided in the processes of the method for manufacturing the solid-state image capture device according to the first embodiment of the present invention.

Next, the first core portion 131a is formed as shown in FIG. 8.

The first core portion 131a is formed on the surface of the hole K formed as described above. For example, the first core portion 131a is formed so as to cover the surface of the hole K by depositing a silicon nitride (SiN) film by plasma CVD.

More specifically, the first core portion 131a is formed such that the surface of the hole K is covered with a film thickness of, for example, 0.5 μm.

(3) Formation of Second Core Portion 131b

Figure 9:
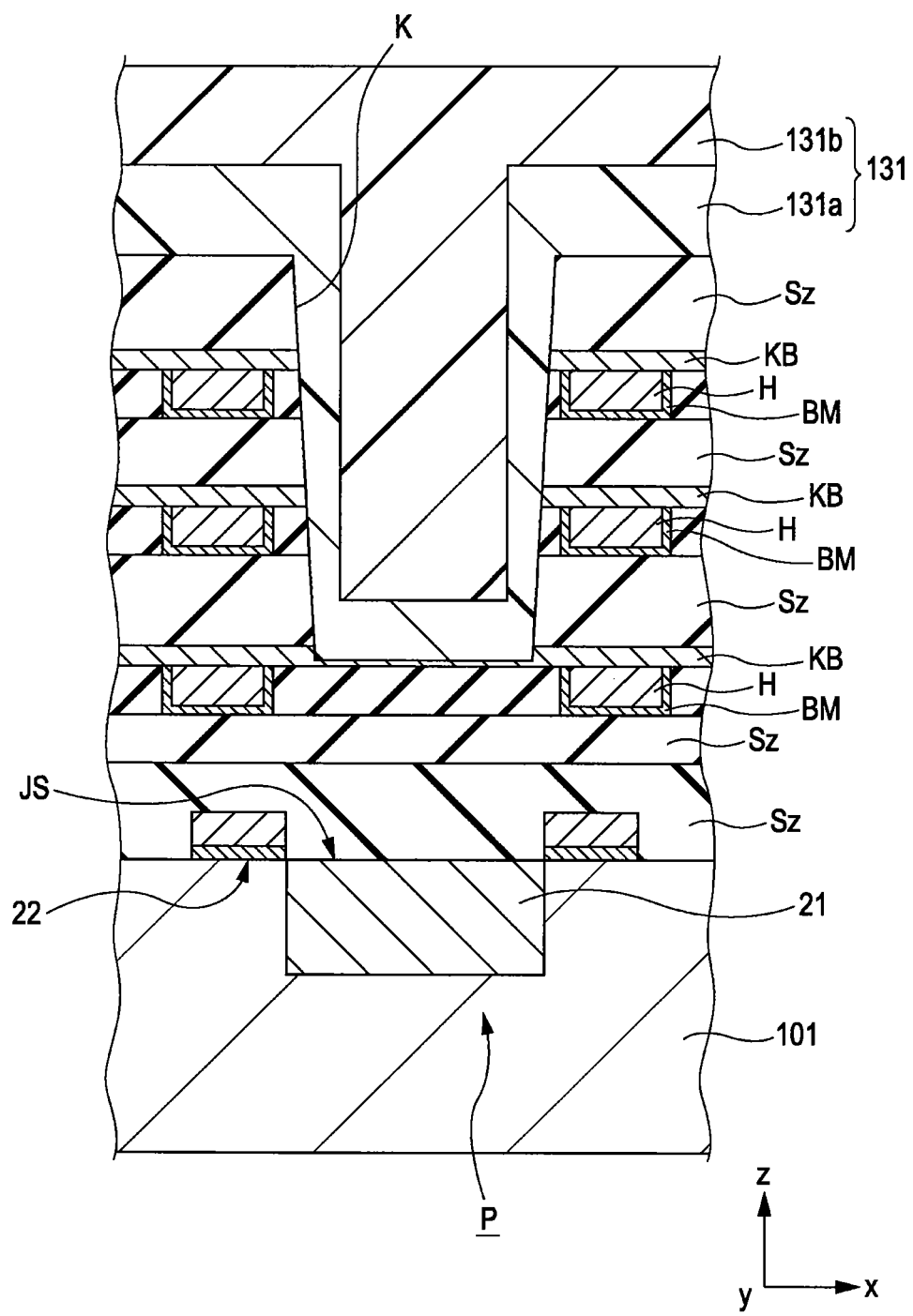
FIG. 9 is a view showing the major portion provided in the processes of the method for manufacturing the solid-state image capture device according to the first embodiment of the present invention.

Next, the second core portion 131b is formed as shown in FIG. 9.

In this case, after the first core portion 131a is deposited on the surface of the hole K in the manner described manner, the hole K is filled with an optical material to form the second core portion 131b. For example, the second core portion 131b is formed by depositing an acrylic resin film by spin coating.

In the manner described above, the optical-waveguide core portion 131 including the first core portion 131a and the second core portion 131b is formed.

(4) Formation of Color Filter 301

Figure 10:
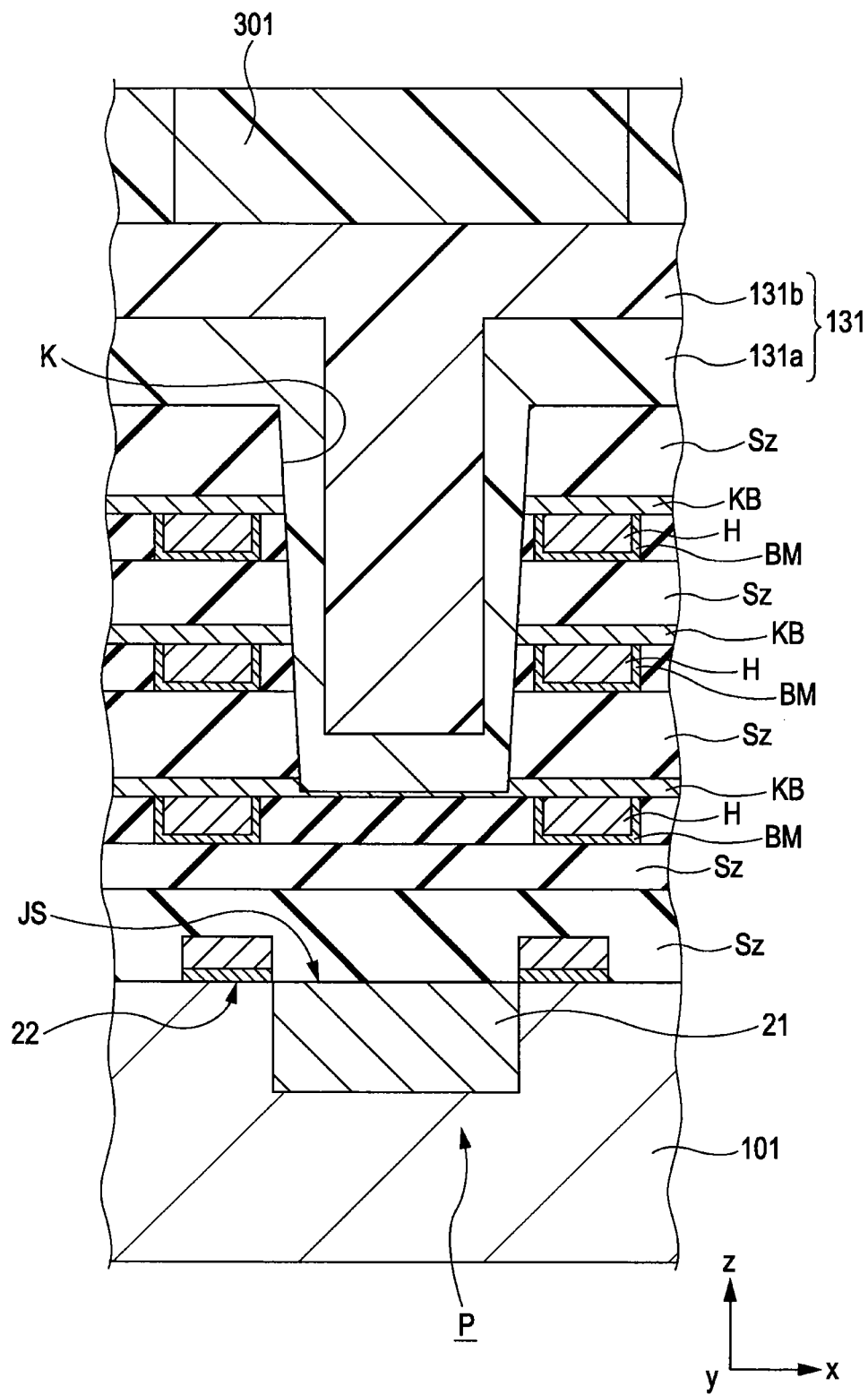
FIG. 10 is a view showing the major portion provided in the processes of the method for manufacturing the solid-state image capture device according to the first embodiment of the present invention.

Next, the color filter 301 is formed as shown in FIG. 10.

In this case, coating fluid containing a pigment and a photosensitive resin is applied by spin coating to form a coated film, and the coated film is subjected to patterning by a lithographic technique, to thereby sequentially form color filter layers constituting the color filter 301.

More specifically, a photomask is irradiated with exposure light, for example, an i ray, to transfer a mask pattern image to a photosensitive resin film, and the resulting photosensitive resin film is subjected to exposure processing. Thereafter, the photosensitive resin film subjected to the exposure processing is subjected to development processing. The above-described processing is executed for each color. As a result of the processing, a green filter layer (not shown), a red filter layer (not shown), and a blue filter layer (not shown) are sequentially provided to form the color filter 301.

(5) Formation of On-Chip Lens 111

Figure 11:
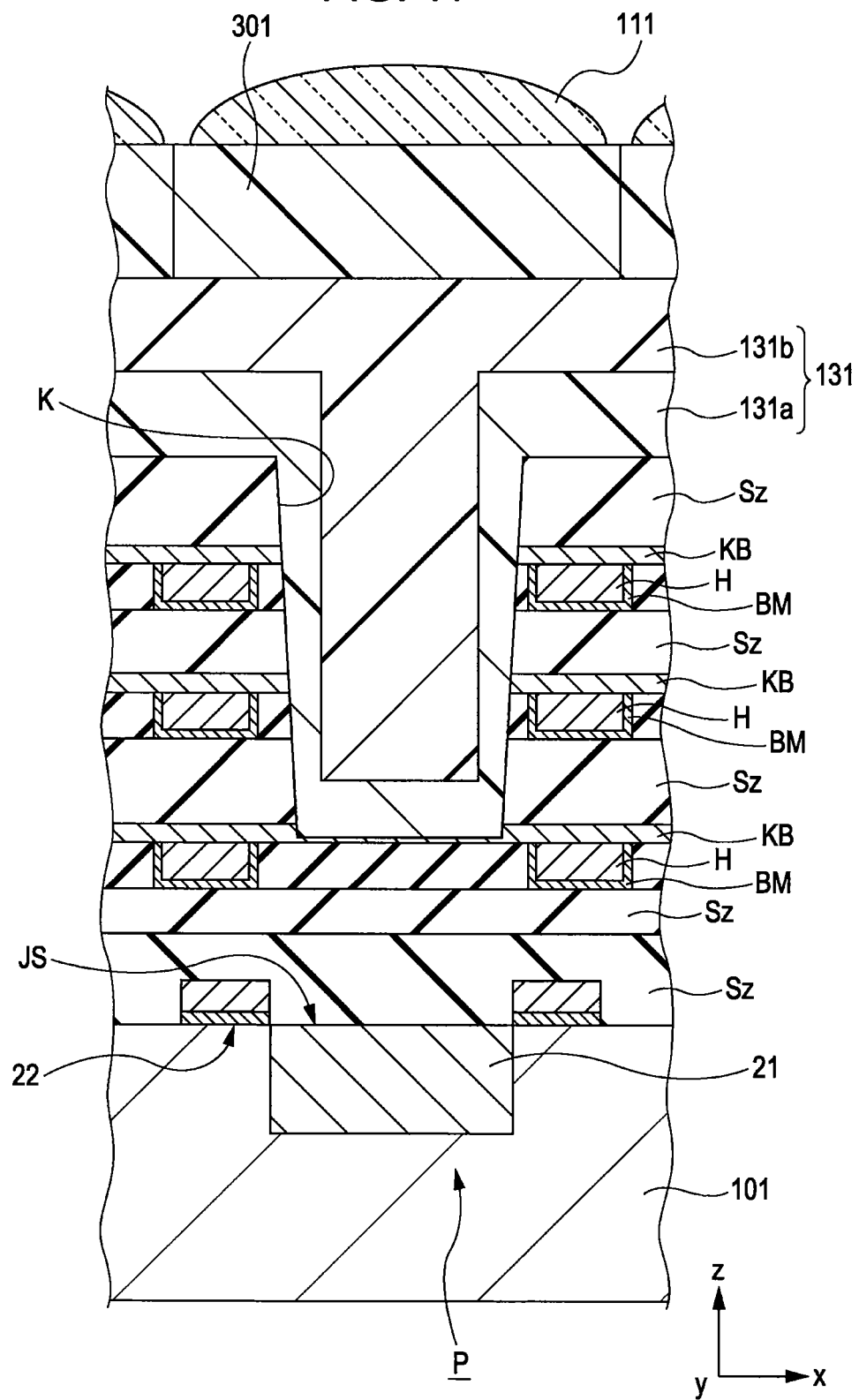
FIG. 11 is a view showing the major portion provided in the processes of the method for manufacturing the solid-state image capture device according to the first embodiment of the present invention.

Next, the on-chip lens 111 is formed as shown in FIG. 11.

In this case, after a lens material film (not shown) is deposited, the lens material film is processed to form the on-chip lens 111.

For example, a polyethylene resin (the refractive index n=1.60) is used to deposit the lens material film (not shown) on the color filter 301. Thereafter, a photosensitive resin film (not shown) is formed on the lens material film. The photosensitive resin film is subjected to processing, such as reflow processing, so as to correspond to the shape of the on-chip lens 111, so that the photosensitive resin film is patterned. Using the patterned photosensitive resin film as a mask, the lens material film is subjected to etch-back processing to thereby form the on-chip lens 111.

In the present embodiment, this formation processing is executed so that multiple on-chip lenses 111 are provided adjacent to each other.

(6) Formation of Antireflection Layer 112

Next, the antireflection layer 112 is formed as shown in FIG. 4.

In this case, coating fluid containing low-refractive-index particles and a binder resin is applied by spin coating to form a coated film, and the coated film is subjected to bake processing, to thereby form the antireflection layer 112.

For example, hollow silica particles (the refractive index=about 1.25 to 1.40) are used as the low-refractive-index particles 112P and a polysiloxane resin (the refractive index=about 1.5) is used as the binder resin 112R.

More specifically, the antireflection layer 112 is formed so that the film thickness d becomes one-fourth the wavelength λ of reflection light. For example, the coated film is formed so that the film thickness d becomes 100 to 200 nm. Thereafter, for example, bake processing is performed for three minutes at a temperature of 120° C. and bake processing is further performed for five minutes at a temperature of 200° C. to volatilize a solvent in the coated film. As a result of the bake processing multiple times, it is possible to suppress foam formation. In the preprocessing before the deposition of the coated film, it is preferable that the on-chip lens 111 be configured so as to maintain hydrophobicity without performing hydrophilic processing.

Through the formation of the individual portions as described above, the solid-state image capture device 1 is completed.

[C] Conclusion

As described above, in the present embodiment, the antireflection layer 112 contains the binder resin 112R and the low-refractive-index particles 112P (see FIG. 5). In this case, the binder resin 112R has a lower refractive index than on-chip lens 111 at the lower layer. The low-refractive-index particles 112P also have a lower refractive index than the binder resin 112R.

Thus, the present embodiment makes it possible to reduce ripple due to a phase difference using the curvature of the low-refractive-index particles 112P. More specifically, since the antireflection layer 112 has an antireflection function because of the low-reflection film and also has a certain degree of curvature, a low-reflection function can easily be realized without a reduction in the effective curvature of the on-chip lenses.

In the present embodiment, hollow silica particles are used as the low-refractive-index particles 112P. The antireflection layer 112 is formed above the light-receiving surface JS in such a manner that more low-refractive-index particles 112P are distributed than the binder resin 112R as the distance from the light-receiving surface JS increases (see FIG. 5). In other words, in the present embodiment, the antireflection layer 112 is formed such that the refractive index increases sequentially in a direction in which the incident light L travels to the light-receiving surface JS.

In the present embodiment, since the antireflection layer 112 has the multi-level antireflection function, it is possible to improve the antireflection characteristic.

More specifically, when the antireflection layer was formed using a silicon oxide film (the refractive index n=1.42), the reflectance for green light was 4%. In contrast, when hollow silica particles (the refractive index n=1.28) were used as the low-refractive-index particles 112P in the antireflection layer 112, as in the present embodiment, the reflectance for green light was reduced to 1% or less.

By changing the refractive index of the antireflection layer 112, it is also possible to optimize the sensitivity characteristic.

Figure 12:
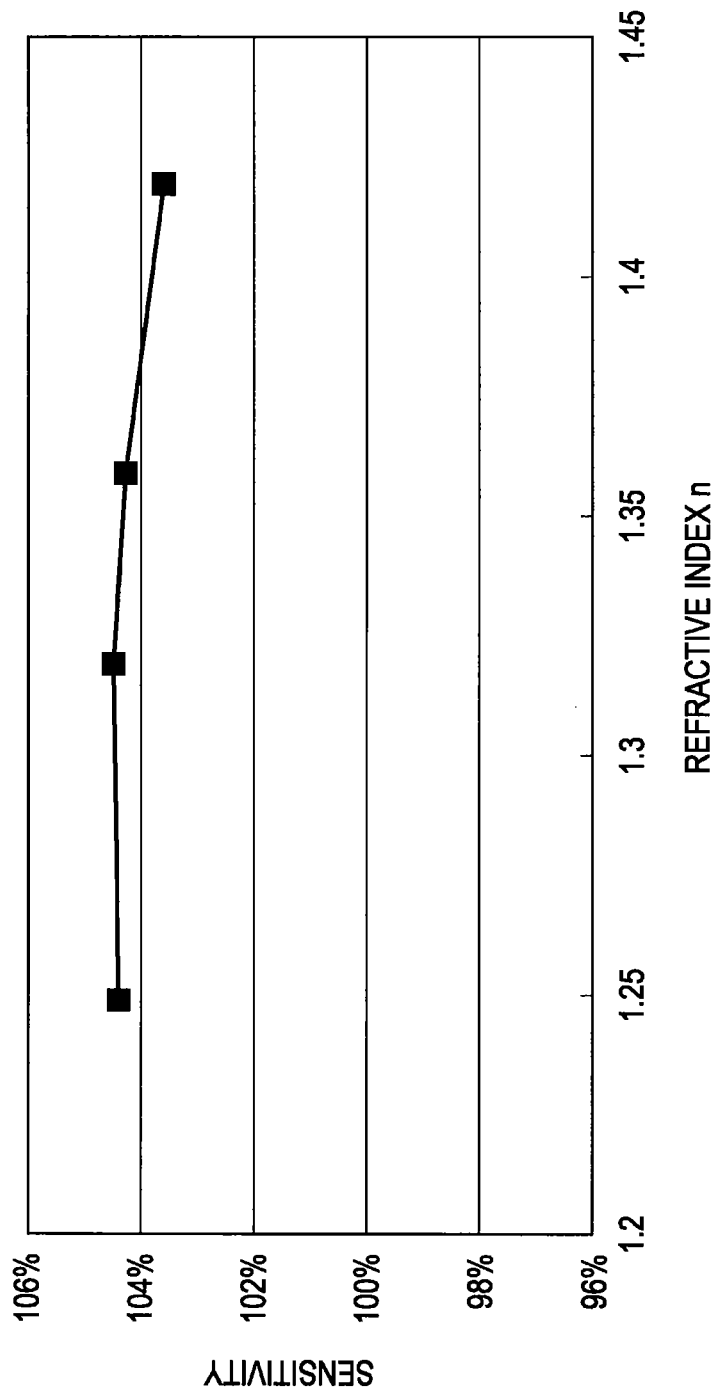
FIG. 12 is a graph showing a refractive index of the antireflection layer versus a sensitivity in the first embodiment of the present invention.

FIG. 12 is a graph showing the refractive index of the antireflection layer 112 versus the sensitivity in the first embodiment of the present invention. The sensitivity shown in FIG. 12 is standardized using the sensitivity of a reference sample.

As shown in FIG. 12, when the refractive index n of the antireflection layer 112 is 1.25 to 1.32, the sensitivity can particularly preferably be improved.

Thus, the present embodiment can improve the image quality of captured images.

2. Second Embodiment

When Film Thickness of Antireflection Layer is Larger at Concave Portion of OCL than Convex Portion

[A] Device Configuration, Etc.

Figure 13:
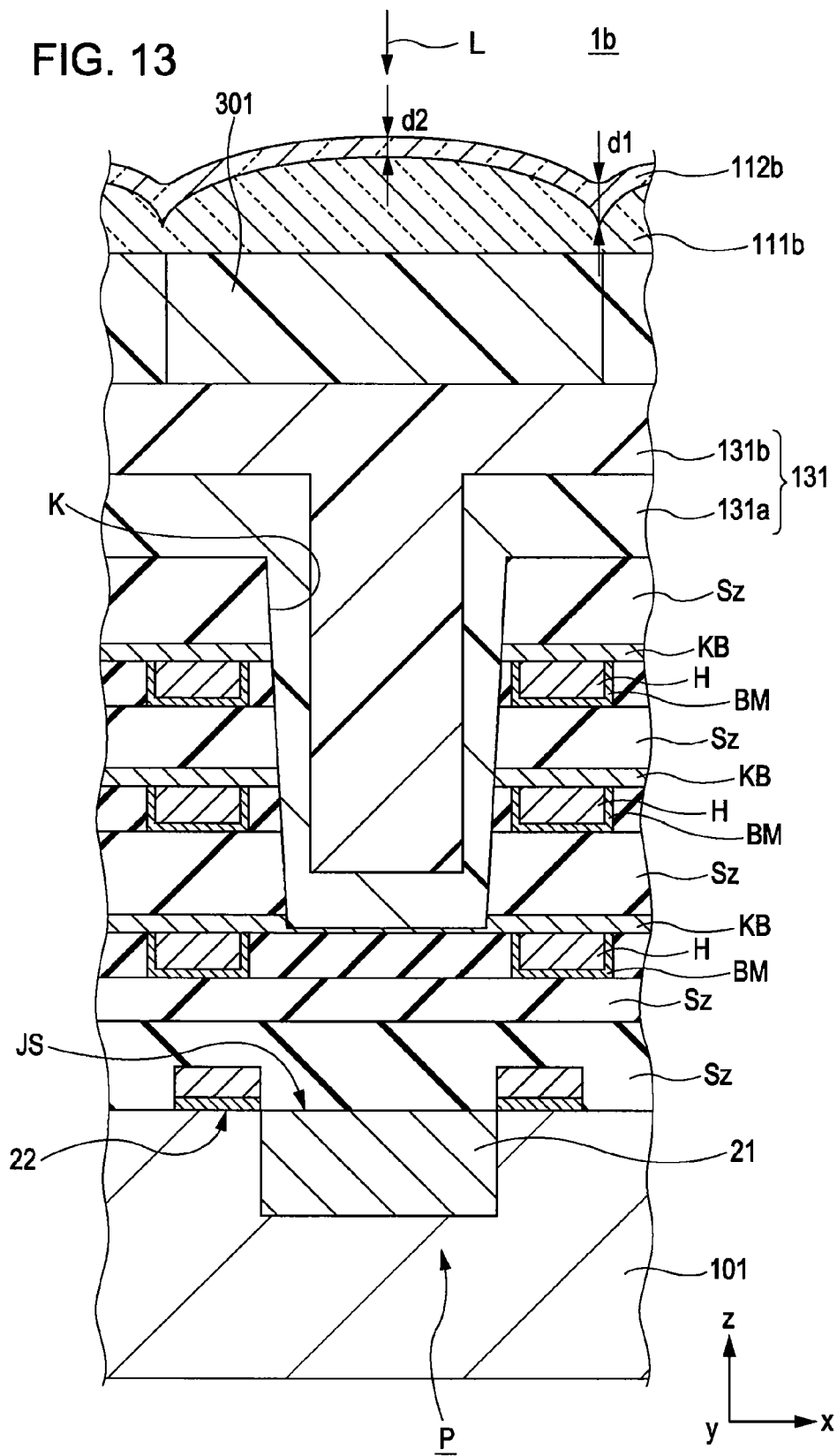
FIG. 13 is a view showing a major portion of a solid-state image capture device according to a second embodiment of the present invention.

FIG. 13 is a schematic view showing a major portion of a solid-state image capture device 1b according to a second embodiment of the present invention. FIG. 13 illustrates a cross section of a portion that is similar to the portion shown in FIG. 4.

As shown in FIG. 13, an on-chip lens 111b of the solid-state image capture device 1b according to the present embodiment is different from the on-chip lens 111 in the first embodiment. An antireflection layer 112b is also different from the antireflection layer 112 in the first embodiment. Except for these points, the present embodiment is the same as the first embodiment. Thus, descriptions of redundant portions are omitted hereinafter.

As shown in FIG. 13, multiple on-chip lenses 111b are arranged adjacent to each other. More specifically, the multiple on-chip lenses 111b are formed to be integrated with each other without spaces therebetween.

The antireflection layer 112b is formed so as to contain a binder resin (not shown) and low-refractive-index particles (not shown), as in the case of the first embodiment. That is, the antireflection layer 112b is formed so as to contain hollow silica particles.

In the present embodiment, as shown in FIG. 13, the antireflection layer 112b is provided so that the surface thereof covers the upper surfaces of the on-chip lenses 111 and thus has a corrugated shape.

In this case, the antireflection layer 112b is provided so that a first film thickness d1 of the concave portions depressed between the on-chip lenses 111b is larger than a second film thickness d2 of the top portions of the on-chip lenses 111b, the top portions protruding in a convex shape.

For example, the antireflection layer 112b is formed so that the second film thickness d2 becomes one-fourth the wavelength λ of reflection light, that is, the second film thickness d2 becomes λ/4. With this arrangement, since reflection light reflected after entering the antireflection layer 112b has a phase shifted from the incident light, the reflection light and light that enters the antireflection layer 112b cancel each other out. This makes it possible to preferably provide an antireflection function. The antireflection layer 112b is formed so that the first film thickness d1 is larger than λ/4, which is the film thickness of the second film thickness d2.

It is preferable to form the antireflection layer 112b so that the first film thickness d1 and the second film thickness d2 satisfy:

$$d2 + \text{"Thickness of On-Chip Lens } 111b\text{"} - d1 > 100 \text{ nm} \quad (A).$$

With this arrangement, it is possible to achieve preferable light focusing performance.

[B] Conclusion

As described above, in the present embodiment, the on-chip lenses 111b have a "gapless structure" and are arranged adjacent to each other. The antireflection layer 112b is provided so as to have a corrugated shape such that the concave portions depressed between the on-chip lenses 111b have a larger thickness than the top portions of the on-chip lenses 111, the top portions protruding in a convex shape.

When gaps (spaces) are provided between the on-chip lenses, the so-called "color mixture" may occur to reduce the image quality of captured images. In the present embodiment, however, such a problem can be prevented, since the on-chip lenses 111b have a gapless structure.

In the present embodiment, the antireflection layer 112b is formed to have the "corrugated shape" described above. Thus, in the present embodiment, since the number of curved surfaces increases compared to the case of d1=d2 (for a typical conformal antireflection layer structure), it is possible to reduce ripple. Thus, it is possible to improve the sensitivity characteristic. In addition, when the lens thickness is to be increased or significantly reduced in accordance with a lower profile or miniaturization, there may be cases in which it is difficult to realize such provision in terms of the process. In such a case, changing the thickness of the film thickness d2 makes it possible to relatively easily control the light-focusing position of the lenses.

More specifically, when compared to a case in which the antireflection layer is not a corrugated-shape-type (d1=d2), the sensitivity to green light can be improved by about 2%.

The antireflection layer 112b in the present embodiment contains a binder resin (not shown) and low-refractive-index particles (not shown), as in the case of the first embodiment. Thus, it is possible to improve the antireflection characteristic, as in the case of the first embodiment.

By changing the refractive index of the antireflection layer 112b, it is also possible to optimize the sensitivity characteristic.

Thus, the present embodiment can improve the image quality of captured images.

3. Third Embodiment

When Surface of Antireflection Layer is Flat

[A] Device Configuration, Etc.

Figure 14:
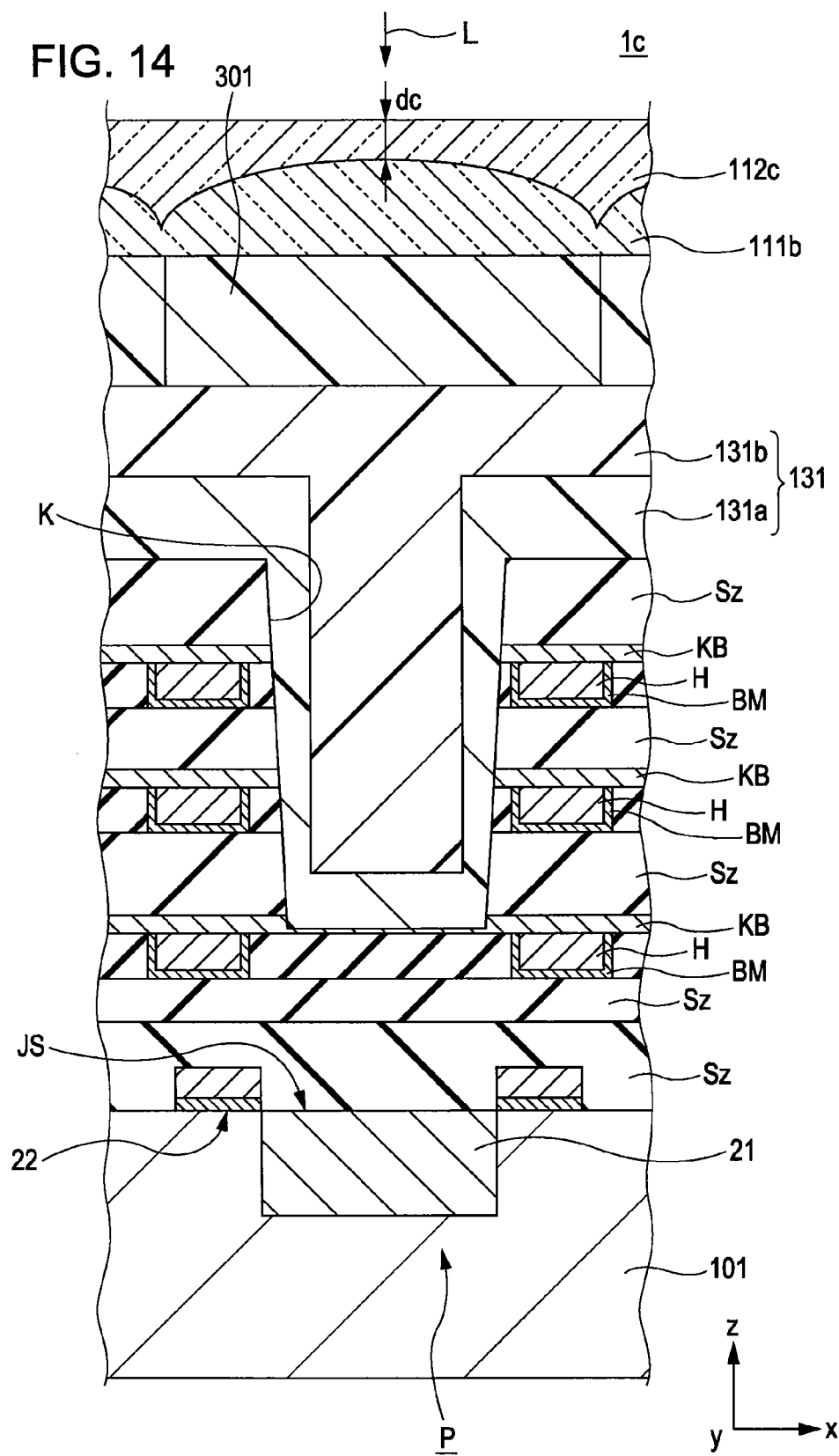
FIG. 14 is a view showing a major portion of a solid-state image capture device according to a third embodiment of the present invention.

FIG. 14 is a schematic view showing a major portion of a solid-state image capture device 1c according to a third embodiment of the present invention. FIG. 14 illustrates a cross section of a portion that is similar to the portion shown in FIG. 4.

As shown in FIG. 14, an antireflection layer 112c of the solid-state image capture device 1c in the present embodiment is different from the antireflection layer 112 in the second embodiment. Except for this point, the present embodiment is the same as the second embodiment. Thus, descriptions of redundant portions are omitted hereinafter.

The antireflection layer 112c is formed so as to contain a binder resin (not shown) and low-refractive-index particles (not shown), as in the case of the second embodiment. That is, the antireflection layer 112c is formed so as to contain hollow silica particles.

In the present embodiment, however, as shown in FIG. 14, the antireflection layer 112c is provided on the upper surface of the on-chip lens 111b so that the surface of the antireflection layer 112c becomes flat along the plane (the xy plane) of the substrate 101, unlike the case in the second embodiment.

In the present embodiment, it is preferable to form the antireflection layer 112c such that a film thickness dc of the top portion of the on-chip lens 111b, the top portion protruding in a convex shape, is, for example, 200 to 600 nm.

[B] Conclusion

As described above, the antireflection layer 112c in the present embodiment is formed so as to contain a binder resin (not shown) and low-refractive-index particles (not shown), as in the case of the first and second embodiments. Thus, it is possible to improve the antireflection characteristic. Adjusting the film thickness of the antireflection layer 112c can improve the sensitivity characteristic.

In addition, when the surface of the antireflection layer is made flat, the light focusing efficiency of the on-chip lenses may decline. However, changing the refractive index of the antireflection layer 112c makes it possible to optimize the sensitivity characteristic.

Figure 15:
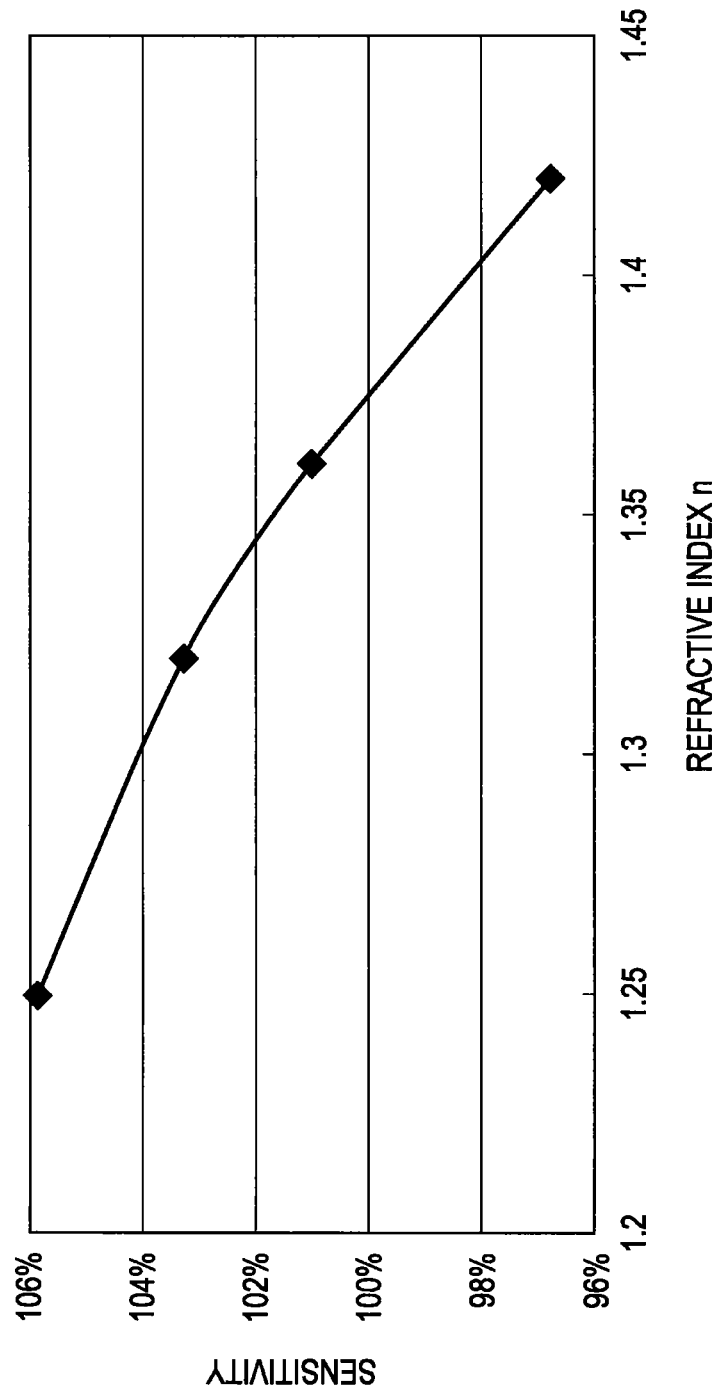
FIG. 15 is a graph showing a refractive index of an antireflection layer versus a sensitivity in the third embodiment of the present invention.

FIG. 15 is a graph showing the refractive index of the antireflection layer 112c versus the sensitivity in the third embodiment of the present invention. The sensitivity shown in FIG. 15 is standardized using the sensitivity of a reference sample.

As shown in FIG. 15, when the refractive index n of the antireflection layer 112c is 1.25, the sensitivity can particularly preferably be improved.

Thus, the present embodiment can improve the image quality of captured images.

4. Fourth Embodiment

When Antireflection Layer has Multiple Layers

[A] Device Configuration, Etc.

Figure 16:
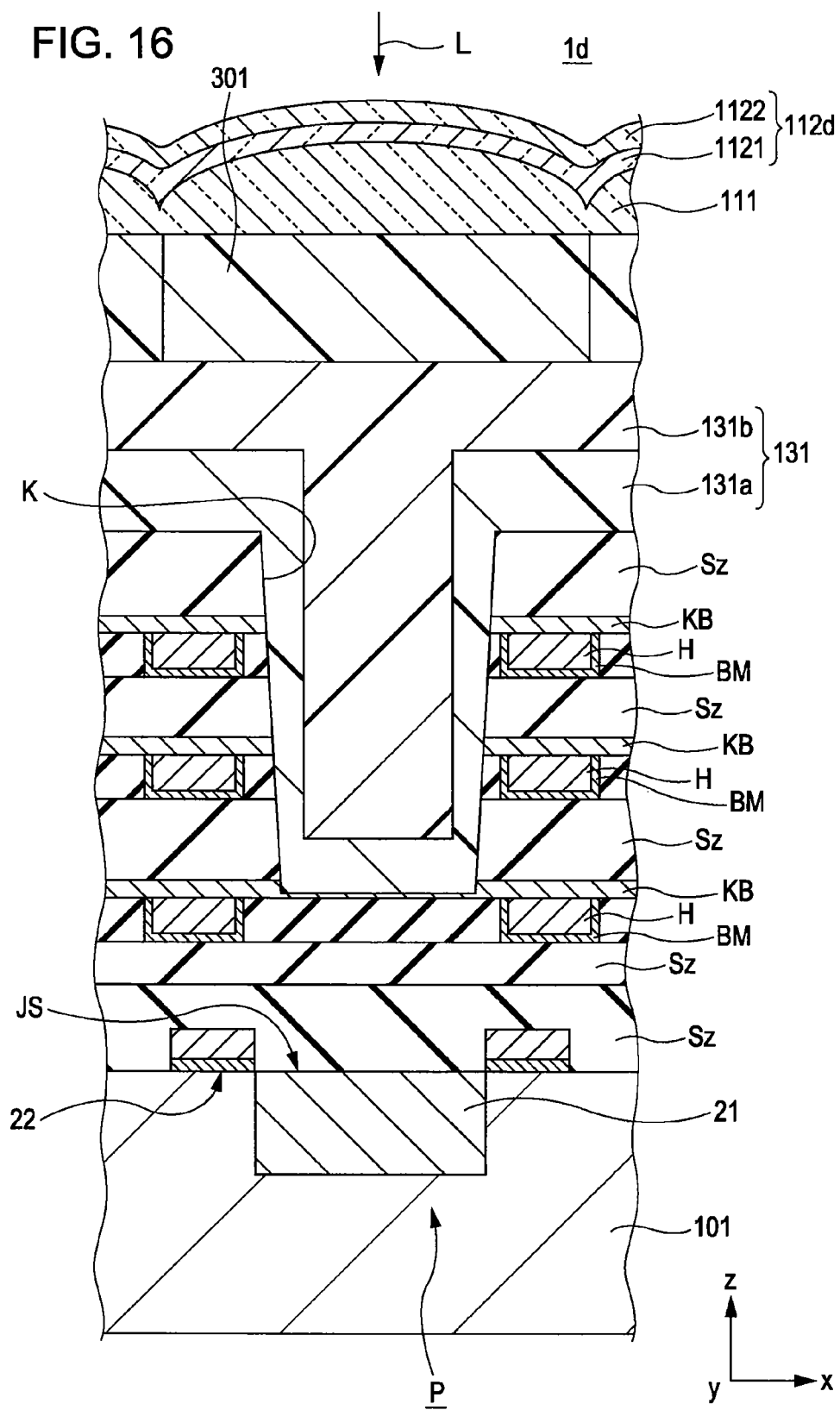
FIG. 16 is a view showing a major portion of a solid-state image capture device according to a fourth embodiment of the present invention.

FIG. 16 is a schematic view showing a major portion of a solid-state image capture device 1d according to a fourth embodiment of the present invention. FIG. 16 illustrates a cross section of a portion that is similar to the portion shown in FIG. 4.

As shown in FIG. 16, an antireflection layer 112d of the solid-state image capture device 1d according to the present embodiment is different from the antireflection layer 112 in the second embodiment. Except for this point, the present embodiment is the same as the second embodiment. Thus, descriptions of redundant portions are omitted hereinafter.

As shown in FIG. 16, the antireflection layer 112d contains a first antireflection layer 1121 and a second antireflection layer 1122.

As shown in FIG. 16, the first antireflection layer 1121 is provided on the upper surfaces of the on-chip lenses 111.

As shown in FIG. 16, the second antireflection layer 1122 is provided above the first antireflection layer 1121.

Each of the first antireflection layer 1121 and the second antireflection layer 1122 in the antireflection layer 112d contains low-refractive-index particles (not shown) and a binder resin (not shown), as in the second embodiment.

In this case, the second antireflection layer 1122 at the upper layer is formed so as to contain more low-refractive-index particles than the first antireflection layer 1121 at the lower layer. For example, the first and second antireflection layers 1121 and 1122 are formed to contain hollow silica particles as the low-refractive-index particles.

More specifically, the first antireflection layer 1121 at the lower layer is formed so as to meet the following conditions:
the content rate of the hollow silica is 10% to 50% by weight (preferably, 10% to 40% by weight), and
the film thickness is 30 to 100 nm.

The second antireflection layer 1122 at the upper layer is formed so as to meet the following conditions:

the content rate of the hollow silica is 10% to 50% by weight (preferably, 20% to 50% by weight), and the film thickness is 30 to 100 nm.

When the first antireflection layer 1121 had a content rate of 40% by weight and a film thickness of 50 nm and the second antireflection layer 1122 had a content rate of 50% by weight and a film thickness of 50 nm, an improvement of 0.5% in the antireflection function was confirmed compared to a single antireflection layer.

[B] Conclusion

As described above, in the present embodiment, the antireflection layer 112d is formed by depositing the multiple antireflection layers 1121 and 1122. In this case, the antireflection layer 112d is formed such that the upper layer contains more low-refractive-index particles than the lower layer.

In the present embodiment, since the antireflection layer 112d has the multi-level antireflection function, it is possible to improve the antireflection characteristic, as in the case of the second embodiment.

Thus, the present embodiment can improve the image quality of captured images.

In the above-described example, it is preferable that the particle size of the low-refractive-index particles contained in the upper layer be larger than the particle size of the low-refractive-index particles contained in the lower layer. In this case, particles having larger particle sizes move upward due to a heat-induced aggregation effect. Thus, a low-refractive-index layer containing larger particles is formed in the upper layer, without application of the particles multiple times.

5. Fifth Embodiment

When OCL Contains Low-Refractive-Index Particles

[A] Device Configuration, Etc.

Figure 17:
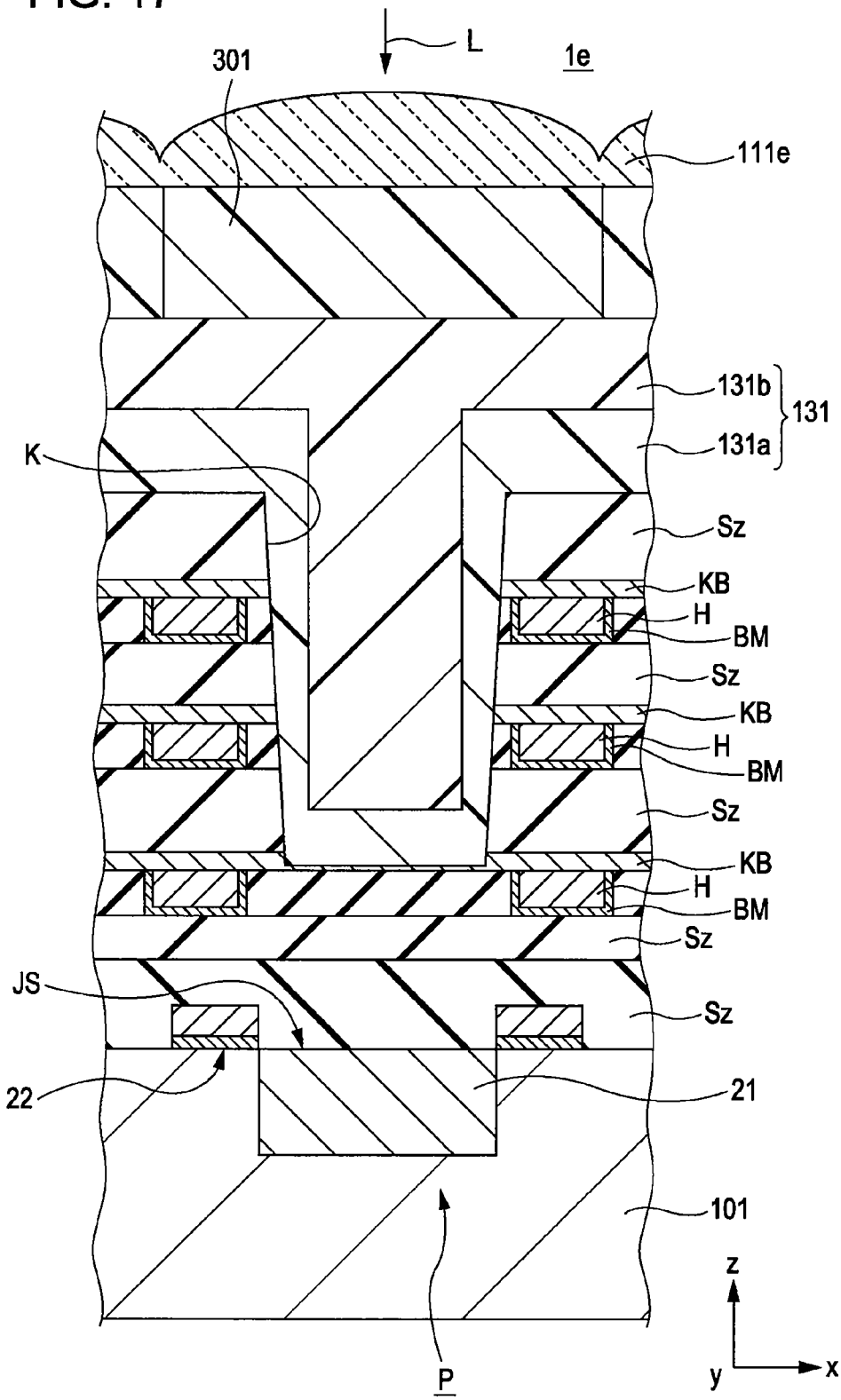
FIG. 17 is a view showing a major portion of a solid-state image capture device according to a fifth embodiment of the present invention.

FIG. 17 is a schematic view showing a major portion of a solid-state image capture device 1e according to a fifth embodiment of the present invention. FIG. 17 illustrates a cross section of a portion that is similar to the portion shown in FIG. 4.

As shown in FIG. 17, the solid-state image capture device 1e has on-chip lenses 111e. The solid-state image capture device 1e has no antireflection layer. Except for this point, the present embodiment is the same as the second embodiment. Thus, descriptions of redundant portions are omitted hereinafter.

The on-chip lenses 111e are formed using low-refractive-index particles (not shown) and a binder resin (not shown), as in the case of the antireflection layer in the second embodiment.

As the low-refractive-index particles, particles having a lower refractive index than the binder resin are used. The low-refractive-index particles contained in the antireflection layers in the other embodiments can preferably be used. For example, it is preferable to use hollow silica particles (the refractive index n=about 1.25 to 1.40).

As the binder resin, a resin having a higher refractive index than the low-refractive-index particles is used. For example, it is preferable to use a polystyrene resin (the refractive index n=1.60).

It is preferable that the low-refractive-index particles 111P be contained in the on-chip lenses 111e to constitute 10% to 50% by weight. When this range is exceeded, there may be cases in which voids are generated in the film and the preservation stability decreases. On the other hand, when the range is not reached, problems such as difficulty in using a material having a low refractive index may arise.

The on-chip lenses 111e are formed by depositing a lens material film (not shown) containing low-refractive-index particles and a binder resin and then processing the lens material film.

FIGS. 18A to 18D are views showing a major portion in processes of manufacturing the on-chip lenses 111e in the solid-sate image capture device 1e according to the fifth embodiment of the present invention. FIGS. 18A to 18D are enlarged cross sectional views of a portion in which the on-chip lenses 111e are formed, the portion being similar to the portion shown in FIG. 4.

(1) Formation of Lens Material Film LM

Figure 18A:
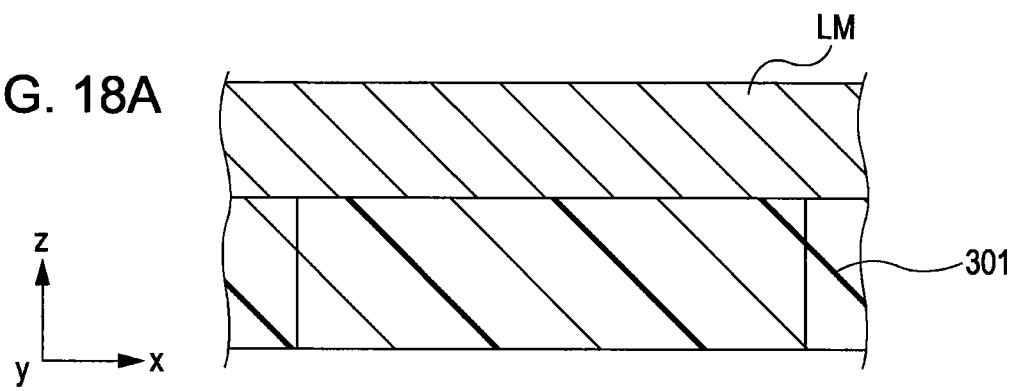
FIGS. 18A to 18D are views showing a major portion including an on-chip lens in the fifth embodiment of the present invention.

First, a lens material film LM is formed as shown in FIG. 18A.

In this case, prior to the formation of the lens material film LM, the color filter 301 is formed as described in the first embodiment (see FIG. 10).

The lens material film LM is deposited on the color filter 301.

More specifically, coating fluid containing the above-described low-refractive-index particles and binder resin is applied by spin coating or the like, and then bake processing is performed to volatilize a solvent to thereby form a lens material film LM having a film thickness of, for example, 500 nm. For example, bake processing is performed for three minutes at a temperature of 120° C. and bake processing is further performed for five minutes at a temperature of 200° C.

Figure 18B:
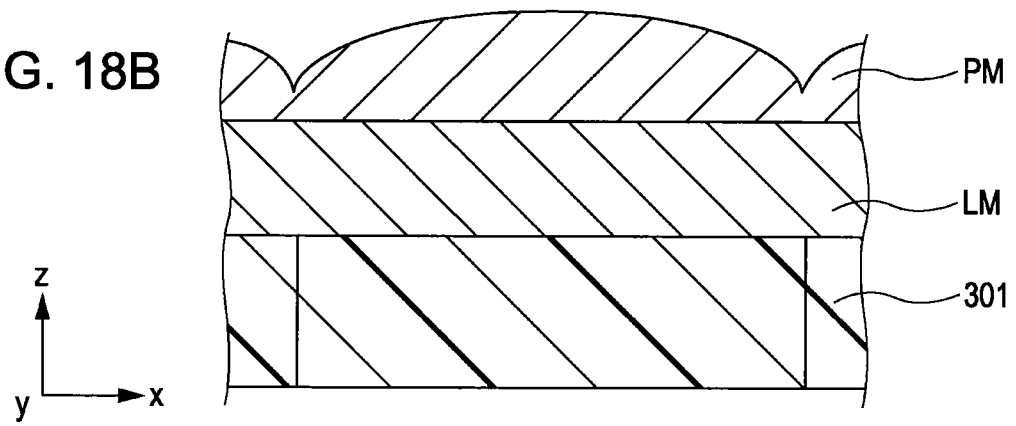

Next, a resist pattern PM is formed as shown in FIG. 18B.

In this case, a photoresist film (not shown) is formed on the lens material film LM, and then the photoresist film is processed so as to correspond to the shape of the on-chip lens 111e. For example, after patterning is performed by a photolithographic technique, and the photoresist film is subjected to reflow processing or the like to form the resist pattern PM having the shape of the on-chip lens 111e. That is, the surface of the resist pattern PM is processed so that it has a curved surface along the lens surface of the on-chip lens 111e.

Figure 18C:
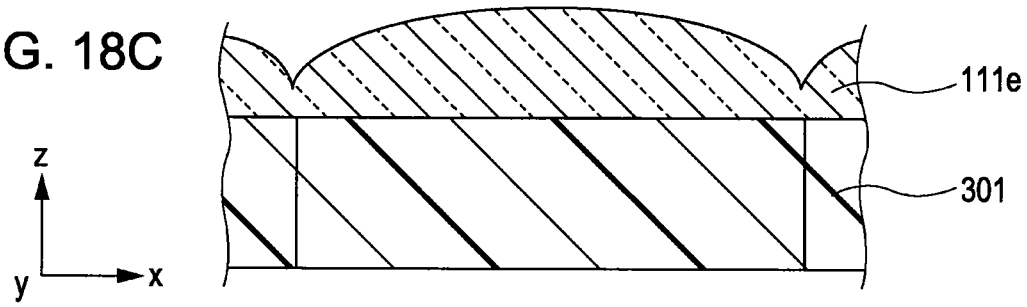

Next, the on-chip lens 111e is formed as shown in FIG. 18C.

In this case, the resist pattern PM processed as described above is used as a mask and the lens material film LM is etched-back by dry-etching processing, to thereby form the on-chip lens 111e. That is, the entire resist pattern PM is removed and part of the lens material film LM is removed. The lens material film LM is left to have a film thickness of at least 50 to 100 nm from the surface of the color filter 301 so that the surface of the color filter 301 is not exposed. The above-described dry etching processing is performed under the conditions that, for example, the gas is tetrafluoromethane ($CF_4$) gas and the power is 700 W.

With this arrangement, the on-chip lens 111e is formed so that, the upper the position is at the center portion thereof, the more low-refractive-index particles are distributed than the binder resin.

Figure 18D:
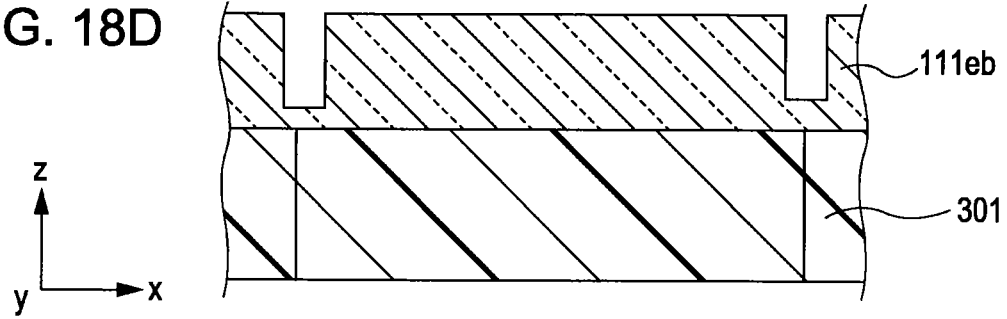

Although a case in which the on-chip lens 111e is formed as a convex lens having a round lens surface has been described above, the present invention is not limited thereto. As shown in FIG. 18D, an on-chip lens 111eb may be formed as a digital lens having a rectangular cross section.

[B] Conclusion

As described above, the on-chip lens 111e in the present embodiment includes the low-refractive-index particles 111P and the binder resin 111R.

Thus, the present embodiment can improve the antireflection characteristic, as in the second embodiment.

Figure 19A:
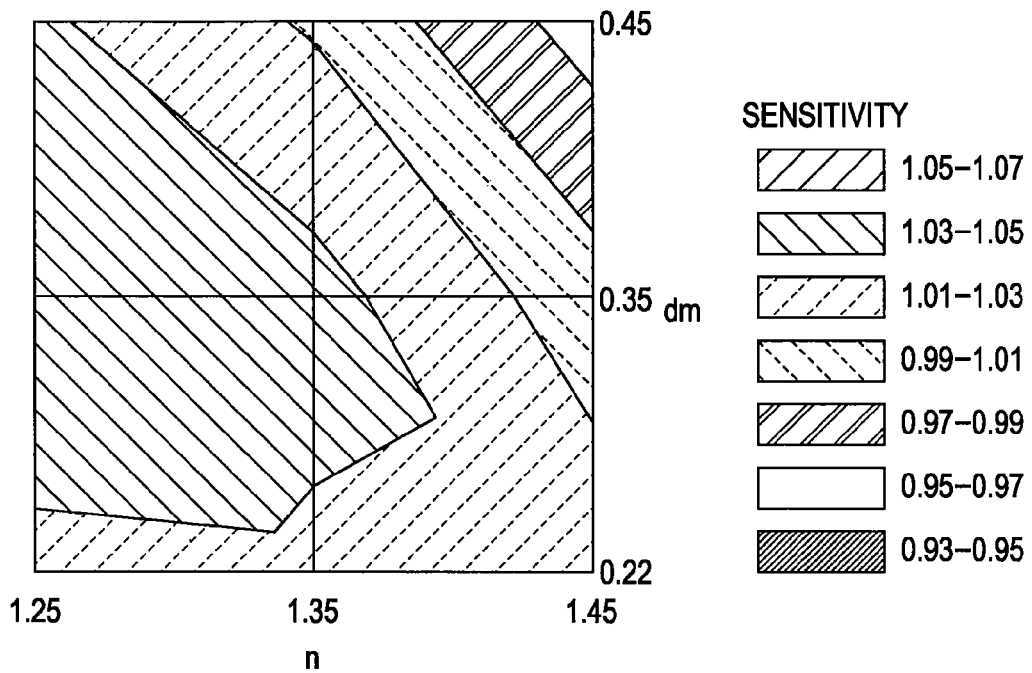
FIGS. 19A and 19B illustrate relationships of the refractive index of the on-chip lens, a film thickness (μm), and a sensitivity in the fifth embodiment of the present invention.
Figure 19B:
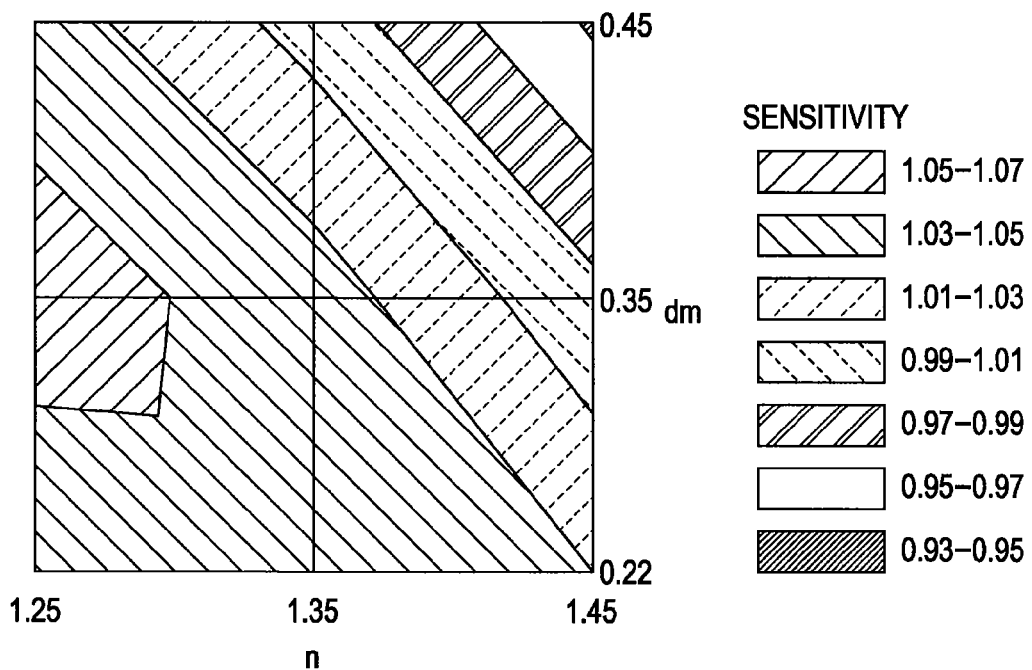

FIGS. 19A and 19B show relationships of the refractive index n of the on-chip lens 111e, the film thickness dm (μm), and the sensitivity in the third embodiment of the present invention. The sensitivities shown in FIGS. 19A and 19B are standardized using the sensitivity of a reference sample (with a refractive index of 1.60). FIG. 19A shows a case in which the camera lens (the optical system 42 in FIG. 1) has an f number of 5.6 and FIG. 19B shows a case in which the camera lens has an f number of 2.8.

As shown in FIGS. 19A and 19B, it is possible to optimize the sensitivity characteristic by changing the refractive index and so on of the on-chip lenses 111e. For example, setting the refractive index n to 1.35 or less makes it possible to improve the sensitivity by 3% or more.

Thus, the present embodiment can improve the image quality of captured images.

<Modifications>

The present invention is not limited to the embodiments described above, and various modifications can be made thereto.

Although a case in which the present invention is applied to a CMOS image sensor has been described in the above-described embodiments, the present invention is not limited thereto. For example, the present invention is applicable to CCD image sensors.

Although a case in which the present invention is applied to a camera has been described in the above-described embodiments, the present invention is not limited thereto. The present invention may also be applied to electronic apparatuses, such as scanners and copiers, having solid-state image capture devices.

In the above-described embodiments, the optical members, such as the on-chip lenses, may be arranged so as to realize the so-called "pupil correction". More specifically, the pitch of the optical members, such as the on-chip lenses, arranged at the image capture surface may be smaller than the pitch of the photodiodes disposed at the image-capture surface.

In the above-described embodiments, the solid-state image capture devices, 1, 1b, 1c, 1d, and 1e correspond to a solid-state image capture device according to the present invention. In the above-described embodiments, the substrate 101 corresponds to a substrate according to the present invention. In the above-described embodiments, the image-capture surface PS corresponds to an image-capture surface according to the present invention. In the above-described embodiments, the light-receiving surface JS corresponds to a light-receiving surface according to the present invention. In the above-described embodiments, the photodiode 21 corresponds to a photoelectric converter according to the present invention. In the above-described embodiments, the on-chip lenses 111, 111b, and 111e correspond to an on-chip lens according to the present invention. In the above-described embodiments, the antireflection layers 112, 112b, 112c, and 112d correspond to an antireflection layer according to the present invention. In the above-described embodiments, the binder resins 111R and 112R correspond to a binder resin according to the present invention. In the above-described embodiments, the low-refractive-index particles 111P and 112P correspond to low-refractive-index particles according to the present invention. In the above-described embodiments, the first film thickness d1 corresponds to a first film thickness according to the present invention. In the above-described embodiments, the second film thickness d2 corresponds to a second film thickness according to the present invention. In the above-described embodiments, the first antireflection layer 1121 corresponds to a first antireflection layer according to the present invention. In the above-described embodiments, the second antireflection layer 1122 corresponds to a second antireflection layer according to the present invention. In the above-described embodiments, the camera 40 corresponds to an electronic apparatus according to the present invention.

The present application contains subject matter related to that disclosed in Japanese Priority Patent Application JP 2009-117401 filed in the Japan Patent Office on May 14, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image capture device comprising:
a photoelectric converter provided in an image capture area of a substrate to receive incident light at a light-receiving surface of the photoelectric converter and photoelectrically convert the incident light to thereby generate signal charge; and
an on-chip lens provided in the image capture area of the substrate and above the light-receiving surface of the photoelectric converter to focus the incident light onto the light-receiving surface,
wherein the on-chip lens contains a binder resin and low-refractive-index particles having a lower refractive index than the binder resin, and wherein the solid-state image capture device does not include an antireflection layer in contact with the on-chip lens.

2. The solid-state image capture device according to claim 1, wherein the on-chip lens contains hollow silica particles as the low-refractive-index particles.

3. The solid-state image capture device according to claim 1, wherein the low-refractive-index particles have a refractive index of n=1.25 to 1.40.

4. The solid-state image capture device according to claim 3, wherein the binder resin has a refractive-index of about n=1.60.

5. The solid-state image capture device according to claim 1, wherein the on-chip lens is a single layer structure.

6. An electronic apparatus comprising:
a photoelectric converter provided in an image capture area of a substrate to receive incident light at a light-receiving surface of the photoelectric converter and photoelectrically convert the incident light to thereby generate signal charge; and
an on-chip lens provided in the image capture area of the substrate and above the light-receiving surface of the photoelectric converter to focus the incident light onto the light-receiving surface,
wherein the on-chip lens contains a binder resin and low-refractive-index particles having a lower refractive index than the binder resin, and wherein the electronic apparatus does not include an antireflection layer in contact with the on-chip lens.

7. The electronic apparatus of claim 6, wherein the on-chip lens contains hollow silica particles as the low-refractive-index particles.

8. The electronic apparatus of claim 6, wherein the low-refractive-index particles have a refractive index of n=1.25 to 1.40.

9. The electronic apparatus of claim 8, wherein the binder resin has a refractive-index of about n=1.60.

10. The electronic apparatus of claim 6, wherein the low-refractive-index particles constitute from 10% to 50% of the on-chip lens by weight.

11. A manufacturing method for a solid-state image capture device, the method comprising the steps of:
   providing a photoelectric converter at an image capture surface of a substrate, the photoelectric converter receiving incident light at a light-receiving surface of the photoelectric converter and photoelectrically converting the incident light to thereby generate signal charge; and
   providing an on-chip lens above the light-receiving surface of the photoelectric converter, the on-chip lens focusing the incident light onto the light-receiving surface, wherein the on-chip lens contains a binder resin and low-refractive-index particles having a lower refractive index than the binder resin, and wherein no antireflection layer is placed in contact with the on-chip lens.

12. The method of claim 11, wherein the on-chip lens contains hollow silica particles as the low-refractive-index particles.

13. The method of claim 11, wherein the low-refractive-index particles have a refractive index of n=1.25 to 1.40.

14. The method of claim 13, wherein the binder resin has a refractive-index of about n=1.60.

15. A solid-state image capture device comprising:
   a photoelectric converter provided in an image capture area of a substrate to receive incident light at a light-receiving surface of the photoelectric converter and photoelectrically convert the incident light to thereby generate signal charge; and
   an on-chip lens provided in the image capture area of the substrate and above the light-receiving surface of the photoelectric converter to focus the incident light onto the light-receiving surface,
   wherein the on-chip lens contains a binder resin and low-refractive-index particles having a lower refractive index than the binder resin, and wherein the low-refractive-index particles constitute from 10% to 50% of the on-chip lens by weight.

16. The solid-state image capture device according to claim 15, wherein the on-chip lens contains hollow silica particles as the low-refractive-index particles.

17. The solid-state image capture device according to claim 15, wherein the solid-state image capture device does not include an antireflection layer in contact with the on-chip lens.

18. The solid-state image capture device according to claim 15, wherein the low-refractive-index particles have a refractive index of n=1.25 to 1.40.

19. The solid-state image capture device according to claim 15, wherein the binder resin has a refractive-index of about n=1.60.

20. A manufacturing method for a solid-state image capture device, the method comprising the steps of:
   providing a photoelectric converter at an image capture surface of a substrate, the photoelectric converter receiving incident light at a light-receiving surface of the photoelectric converter and photoelectrically converting the incident light to thereby generate signal charge; and
   providing an on-chip lens above the light-receiving surface of the photoelectric converter, the on-chip lens focusing the incident light onto the light-receiving surface, wherein the on-chip lens contains a binder resin and low-refractive-index particles having a lower refractive index than the binder resin, and wherein the low-refractive-index particles constitute from 10% to 50% of the on-chip lens by weight.

21. The method of claim 20, wherein the on-chip lens contains hollow silica particles as the low-refractive-index particles.

22. The method of claim 20, wherein the solid-state image capture device does not include an antireflection layer in contact with the on-chip lens.

23. The method of claim 20, wherein the low-refractive-index particles have a refractive index of n=1.25 to 1.40.

24. The method of claim 20, wherein the binder resin has a refractive-index of about n=1.60.

* * * * *